(12) United States Patent
Hanyu et al.

(10) Patent No.: US 10,896,729 B2
(45) Date of Patent: Jan. 19, 2021

(54) DATA WRITE CIRCUIT OF RESISTIVE MEMORY ELEMENT

(71) Applicant: Tohoku University, Miyagi (JP)

(72) Inventors: Takahiro Hanyu, Miyagi (JP); Daisuke Suzuki, Miyagi (JP); Hideo Ohno, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/463,938

(22) PCT Filed: Oct. 31, 2017

(86) PCT No.: PCT/JP2017/039354
§ 371 (c)(1),
(2) Date: Nov. 20, 2019

(87) PCT Pub. No.: WO2018/100954
PCT Pub. Date: Jun. 7, 2018

(65) Prior Publication Data
US 2020/0082884 A1 Mar. 12, 2020

(30) Foreign Application Priority Data
Nov. 29, 2016 (JP) .................................. 2016-231457

(51) Int. Cl.
*G11C 11/00* (2006.01)
*G11C 13/00* (2006.01)
(Continued)

(52) U.S. Cl.
CPC .......... *G11C 13/0069* (2013.01); *G11C 11/15* (2013.01); *G11C 11/1657* (2013.01); *G11C 11/1675* (2013.01); *G11C 2013/0078* (2013.01)

(58) Field of Classification Search
CPC ............ G11C 13/0069; G11C 13/0004; G11C 13/0007; G11C 2013/0073; G11C 13/004;
(Continued)

(56) References Cited

U.S. PATENT DOCUMENTS

2015/0179924 A1* 6/2015 Romanovskyy ........ H01L 43/08
365/158

FOREIGN PATENT DOCUMENTS

| JP | 2012203944 A | 10/2012 |
|----|--------------|---------|
| JP | 2013045483 A | 3/2013 |
| WO | 2015147016 A1 | 10/2015 |

OTHER PUBLICATIONS

Poster from the 61st Annual Conference on Magnetism and Magnetic Materials Oct. 31-Nov. 4, 2016, New Orleans, USA, (Session: MRAM and Magnetic Logic Devices III—EU-12).
(Continued)

*Primary Examiner* — Thong Q Le
(74) *Attorney, Agent, or Firm* — Fox Rothschild LLP; Robert J. Sacco; Carol E. Thorstad-Forsyth

(57) ABSTRACT

A data write circuit of a resistive memory element is provided, the device being capable of writing with low writing energy using a simple circuit. The data write circuit of the resistive memory element, includes: a complementary resistive memory element; writing means for making the complementary resistive memory element cause a resistance change; detection means for detecting a writing state in the complementary resistive memory element; and control means for controlling writing by the writing means, based on a detected signal of the detection means.

5 Claims, 17 Drawing Sheets

(51) Int. Cl.
*G11C 11/15* (2006.01)
*G11C 11/16* (2006.01)
(58) Field of Classification Search
CPC ....... G11C 14/00; G11C 11/21; G11C 11/404;
G11C 11/407; G11C 11/4072; G11C
13/00; G11C 13/0023; G11C 11/1655;
G11C 11/1673; G11C 11/1675; G11C
2013/0078; G11C 11/16; G11C 11/1659;
G11C 11/1693; G11C 13/0011; G11C
2013/0042; G11C 2013/0088; G11C
2213/79
See application file for complete search history.

(56) References Cited

OTHER PUBLICATIONS

Suzuki et al. "A Self-Terminated One-Time Complementary-MTJ Write Driver for Nonvolatile Logic LSI" Sep. 24, 2016, 61st Annual Conference on Magnetism and Magnetic Materials Oct. 31-Nov. 4, 2016, New Orleans, USA.
Suzuki et al, Abstract from the 61st Annual Conference on Magnetism and Magnetic Materials Oct. 31-Nov. 4, 2016, New Orleans, USA, (Session: MRAM and Magnetic Logic Devices III—EU-12).
Suzuki et al., Web Itinerary from the 61st Annual Conference on Magnetism and Magnetic Materials Oct. 31-Nov. 4, 2016, New Orleans, USA, (Session: MRAM and Magnetic Logic Devices III—EU-12).

* cited by examiner

FIG. 8
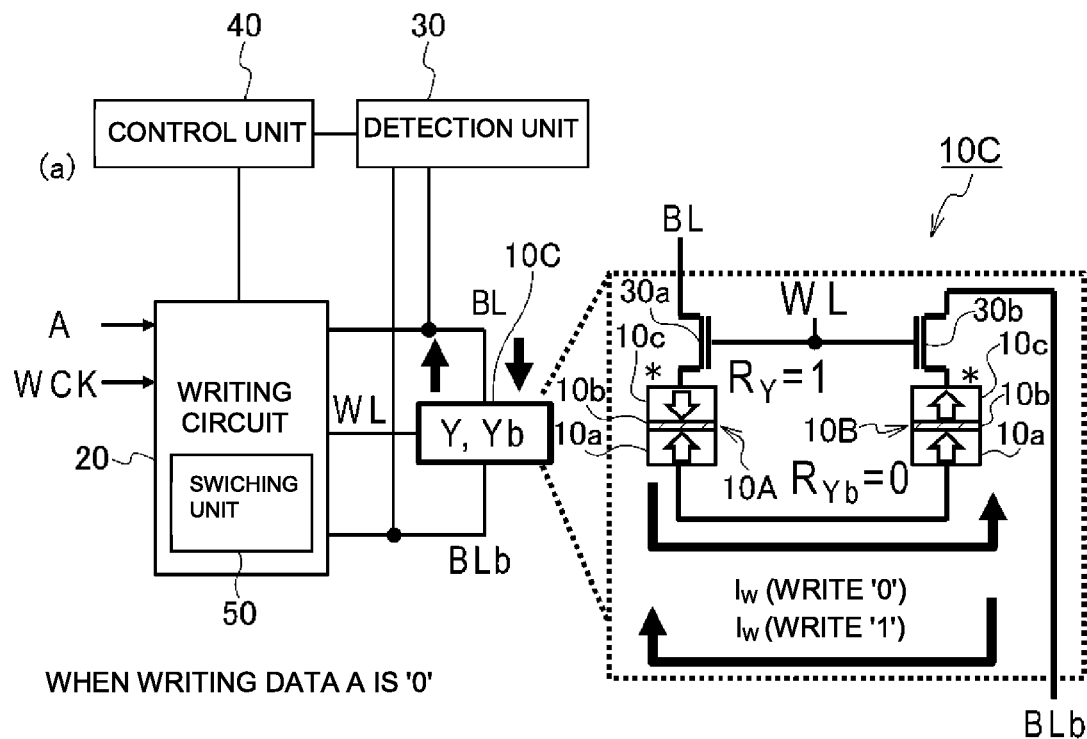
(a)
WHEN WRITING DATA A IS '0'
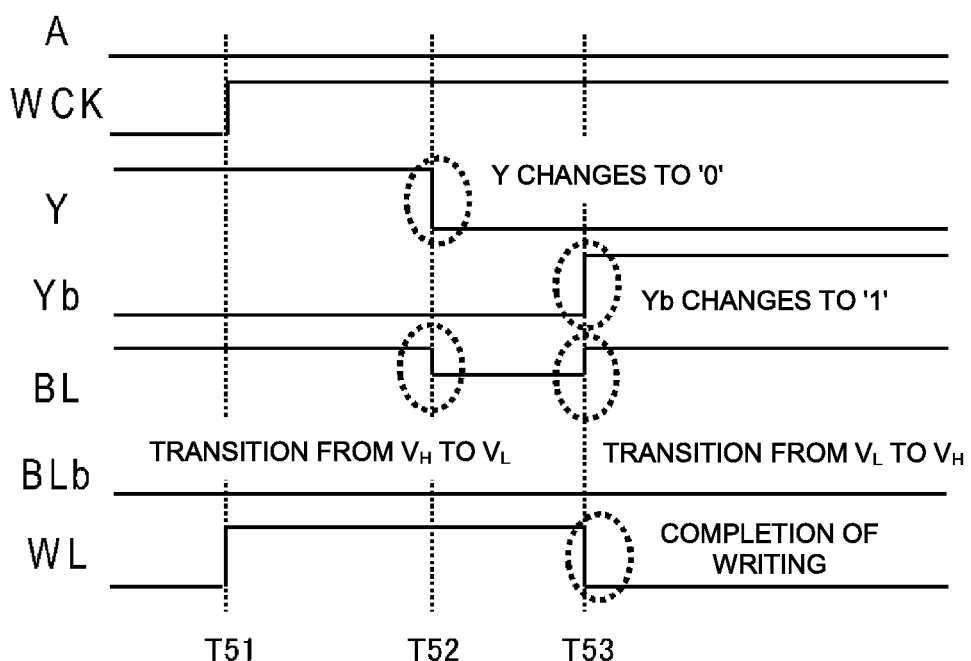
(b)

DATA WRITE CIRCUIT OF RESISTIVE MEMORY ELEMENT

CROSS REFERENCE TO RELATED APPLICATIONS

This application is a § 371 U.S. National Phase Entry of International Patent Application No. PCT/JP2017/039354 filed on Oct. 31, 2017, which claims priority to and the benefit of Japanese Patent Application No. 2016-231457, filed on Nov. 29, 2016, the entireties of which are hereby incorporated herein by reference.

TECHNICAL FIELD

The present invention relates to a data write circuit of a resistive memory element.

BACKGROUND ART

Resistive memory elements are memory elements that use a resistance state due to write current. The resistance state changing timing varies among the elements. Accordingly, to apply write current to the resistive memory element, time sufficient to change the resistance change state of the memory element is required. Thus, even after the resistance state of the resistive memory element is changed, the write current is kept supplied to the memory element. Accordingly, there is a problem in viewpoint of power consumption.

As a technique to detect completion of writing data into a resistive memory element, a circuit has been proposed that detects the change in the voltage level of the resistive memory element due to the switching according to the current direction of write current, and detects the completion of the data writing on the basis of the detected change in the voltage (Patent Literature 1).

CITATION LIST

Patent Literature

Patent Literature 1: WO2015/147016

SUMMARY OF INVENTION

Technical Problem

Incidentally, as a resistive memory element, a magnetic tunnel junction device (MTJ device) has a relatively low tunnel magnetoresistance ratio TMR. Accordingly, a sense amplifier with high sensitivity is required.

As a configuration of improving the output of a resistive memory element, a complementary cell has been proposed. For example, in a memory device provided with two resistive memory elements in one cell and stores information as states different between the elements, for information reading, the information is read from the elements in parallel, thereby allowing the information to be detected highly sensitively even in a case of using a low-sensitive sense amplifier.

To perform writing securely in the resistive memory element, write current pulses for a long time period are required. It is assumed that energy consumption is reduced by automatically finishing the write current when data is written.

However, among configurations applying write current to the two resistive memory elements in the complementary cell and of complementarily writing information, a configuration of automatically stopping the writing operation after data is written has not been known. Accordingly, the complementary resistive memory element has a problem in that the writing energy is high.

In such situations, in the complementary resistive memory element, it is required to realize a method which can automatically stop writing operation just after the desired data is written, with a simple configuration and low write energy.

Solution to Problem

A data write circuit of a resistive memory element of the present invention includes at least the following configuration.

A data write circuit of a resistive memory element, includes:
   a complementary resistive memory element;
   writing means for making the complementary resistive memory element cause a resistance change;
   detection means for detecting a writing state in the complementary resistive memory element; and
   control means,
   the control means controlling writing by the writing means, based on a detected signal of the detection means.

Advantageous Effects of Invention

According to the present invention, a data write circuit of a resistive memory element is provided, the device being capable of writing with low writing energy using a simple circuit.

BRIEF DESCRIPTION OF DRAWINGS

FIG. 8 shows a diagram for illustrating a data write circuit of a resistive memory element according to a third embodiment of the present invention, (a) shows a configuration of the data write circuit of the resistive memory element according to the third embodiment, and (b) shows a timing chart showing an example of the data write circuit of the resistive memory element shown in (a);

DESCRIPTION OF EMBODIMENTS

The data write circuit of the resistive memory element according to an embodiment of the present invention includes: a complementary resistive memory element; writing means for making the complementary resistive memory element cause a resistance change; detection means for detecting a writing state in the complementary resistive memory element; and control means. The control means controls writing by the writing means, based on a detected signal of the detection means.

Hereinafter, referring to the diagrams, an embodiment of the present invention is described. The embodiment of the present invention includes the illustrated content, but is not limited only thereto. Note that in the following description of each diagram, parts common to already described portions are assigned the same symbols, and redundant description is partially omitted.

(Schematic Configuration of Resistive Memory Element)

Figure 1:
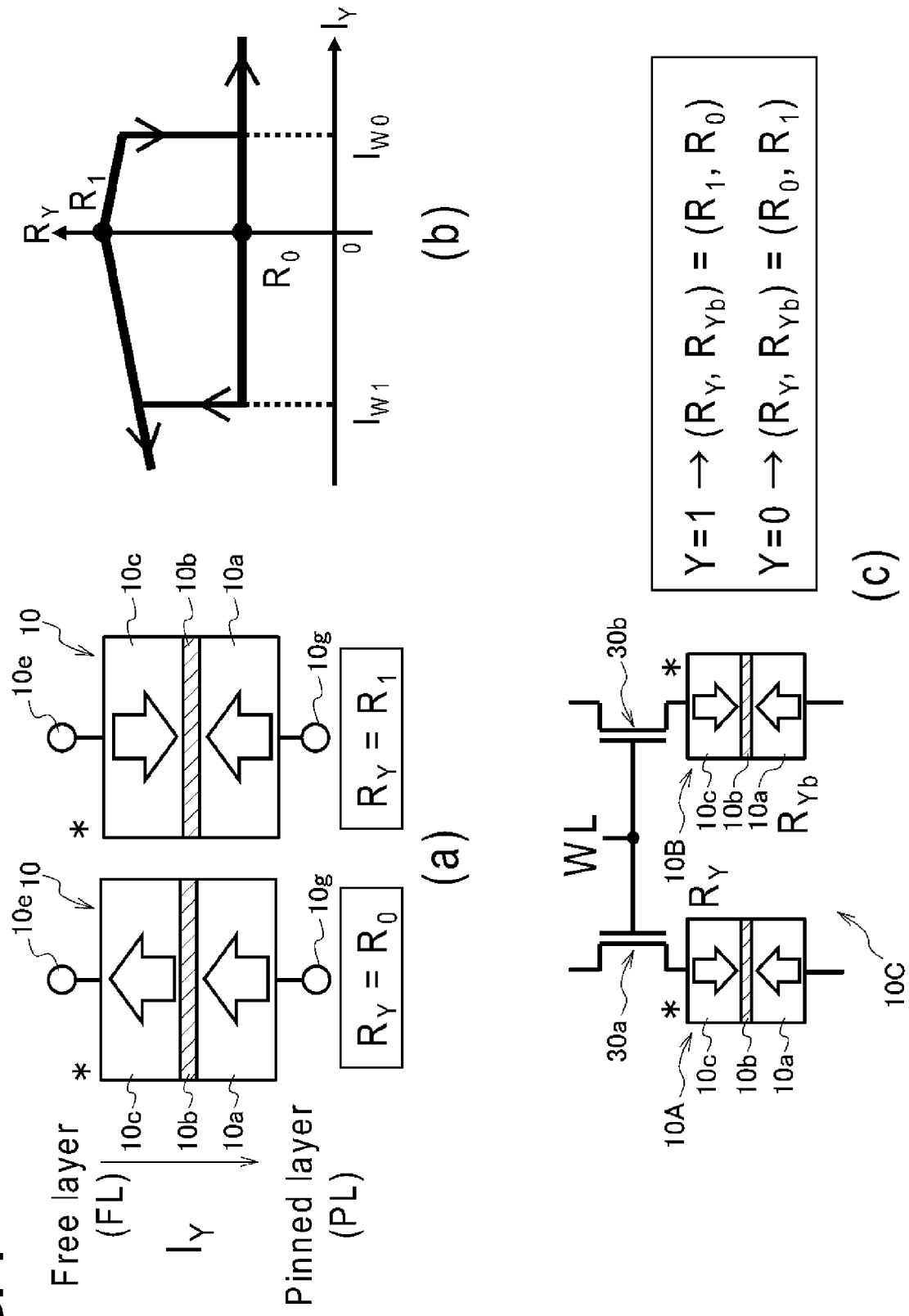
FIG. 1 shows a conceptual diagram for illustrating a resistive memory element for a data write circuit according to an embodiment of the present invention, (a) shows a configuration example, (b) shows an example of the resistance-voltage characteristics of the resistive memory element, and (c) shows a circuit diagram showing a configuration example of a complementary circuit.

As shown in (a) of FIG. 1, a resistive memory element 10 used for the embodiment of the present invention is, for example, a resistive memory element, such as an MTJ device (magnetic tunneling junction) device. When write current is supplied, the resistance state is changed.

In detail, as shown in (a) of FIG. 1, the resistive memory element 10 includes a fixed magnetization layer 10a, a tunnel barrier layer 10b, and a free magnetization layer 10c. In (a) of FIG. 1, a mark (*) indicating the free magnetization layer 10c of the resistive memory element 10 is indicated adjacent to the free magnetization layer 10c.

The fixed magnetization layer 10a is formed directly on a conductive layer (not shown). The tunnel barrier layer 10b is formed on the fixed magnetization layer 10a. The free magnetization layer 10c is formed directly on the tunnel barrier layer 10b. The fixed magnetization layer 10a and the free magnetization layer 10c are made of a material, such as ferromagnetic film (e.g., CoFeB etc.), or ferromagnetic Heusler alloy (e.g., $Co_2FeAl$, $Co_2MnSi$, etc.). The fixed magnetization layer 10a is configured such that even when current flows in the layer in the direction perpendicular to the surface, the direction of the magnetization can be in a state of being fixed along the direction perpendicular to the surface of the layer. The free magnetization layer 10c is configured to have reversible magnetization. In detail, in this embodiment, the free magnetization layer 10c is configured such that the direction of magnetization is parallel or antiparallel to the magnetization of the fixed magnetization layer 10a. The tunnel barrier layer 10b is a thin film provided between the fixed magnetization layer 10a and the free magnetization layer 10c and, for example, is made of a material, such as magnesium oxide (MgO), alumina ($Al_2O_3$), or spinel single crystal ($MgAl_2O_4$). In the example shown in (a) of FIG. 1, a terminal 10g is provided on the fixed magnetization layer 10a. A terminal 10e is provided on the free magnetization layer 10c.

In the resistive memory element 10, when the direction of the magnetization of the free magnetization layer 10c is relatively changed from the direction of the magnetization of the fixed magnetization layer 10a, the resistance value changes. In detail, as shown in the left diagram of (a) of FIG. 1, when the magnetization of the free magnetization layer 10c and the magnetization of the fixed magnetization layer 10a are in the parallel state, the resistance value $R_Y$ of the resistive memory element 10 is a resistance value $R_0$.

As shown in the right diagram of (a) of FIG. 1, when the magnetization of the free magnetization layer 10c and the magnetization of the fixed magnetization layer 10a are in the antiparallel state, the resistance value $R_Y$ of the resistive memory element 10 is a resistance value $R_1$ higher than the resistance value $R_0$ ($R_0 < R_1$).

To switch the resistance state of the resistive memory element 10, as shown in (b) of FIG. 1, current $I_Y$ having a current value (current threshold) required for magnetization reversal is applied. In detail, when the resistive memory element 10 is in a high resistance state ($R_Y = R_1$) and the current $I_Y$ equal to or higher than the current threshold ($I_{W0}$) flows from the free magnetization layer 10c to the fixed magnetization layer 10a, the magnetization of the free magnetization layer 10c is reversed, and the magnetizations of the free magnetization layer 10c and the fixed magnetization layer 10a become in the parallel state, thus switching the state to a low resistance state ($R_Y = R_0$).

On the other hand, when the resistive memory element 10 is in the low resistance state ($R_Y = R_0$) and the current $I_Y$ equal to or higher than the current threshold ($I_{W1}$) flows from the fixed magnetization layer 10a to the free magnetization layer 10c, the magnetization of the free magnetization layer 10c is reversed, and the magnetizations of the free magnetization layer 10c and the fixed magnetization layer 10a become in the antiparallel state, thus switching the state to the high resistance state ($R_Y = R_1$).

The absolute value of the current threshold ($I_{W0}$) is defined to be a value smaller than the absolute value of the current threshold ($I_{W1}$).

In the embodiment of the present invention, one complementary cell includes two resistive memory elements in different resistance states from each other, and is configured to be capable of storing one-bit information by means of the combination of the resistance states.

In detail, as shown in (c) of FIG. 1, the complementary cell 10C includes a resistive memory element 10A, a resistive memory element 10B, an NMOS transistor 30a, and an NMOS transistor 30b. The drain of the NMOS transistor 30a is electrically connected to the free magnetization layer 10c side of the resistive memory element 10A. The drain of the NMOS transistor 30b is electrically connected to the free magnetization layer 10c side of the resistive memory element 10A. The gate of the NMOS transistor 30a and the gate of the NMOS transistor 30b are electrically connected to a word line WL.

When the state of the complementary cell 10C having the above configuration is Y=1, ($R_Y$, $R_{Yb}$)=($R_1$, $R_0$) is satisfied. When the state of the complementary cell 10C is Y=0, ($R_Y$, $R_{Yb}$)=($R_0$, $R_1$) is satisfied. Note that Y indicates the state of the cell. Yb indicates the state (reversed state) of the cell.

First Embodiment: Type1

Next, a data write circuit of a resistive memory element according to a first embodiment of the present invention is described with reference to FIGS. 2, 3, 4 and the like.

Figure 2:
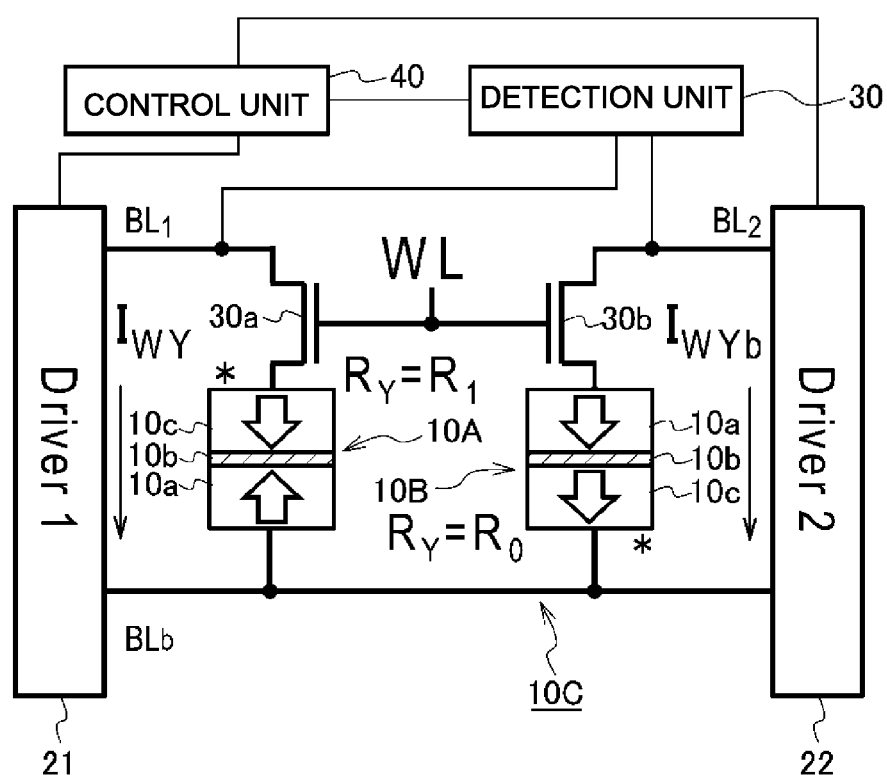
FIG. 2 shows a configuration example of a data write circuit of a resistive memory element according to a first embodiment of the present invention.

In this embodiment, as shown in FIG. 2, the data write circuit of the resistive memory element includes: a complementary resistive memory element (complementary cell 10C); writing means for making the complementary resistive memory element (complementary cell 10C) cause a resistance change; detection means (detection unit 30) for detecting a writing state in the complementary resistive memory element (complementary cell 10C); and control means (control unit 40) for controlling writing by the writing means, based on a detected signal of the detection means (detection unit 30).

In detail, in this embodiment, the writing means includes writing units (write circuits 21 and 22) corresponding to the resistive memory elements (10A and 10B) of the complementary resistive memory element (complementary cell 10C). Writing is simultaneously performed by the writing units (write circuits 21 and 22) into the respective resistive memory elements 10A and 10B so as to cause resistance changes opposite to each other. The control means (control unit 40) performs a writing completion control of the resistive memory elements (10A and 10B) on the basis of the writing states of the respective resistive memory elements (10A and 10B) by the detection means (detection unit 30). Note that the writing operations of the resistive memory element 10A and the resistive memory element 10B can be performed independently of each other. Accordingly, the operations may be performed simultaneously or at any timing. In the case of simultaneously performing the operations, the writing time can be reduced.

As shown in FIG. 2, in detail, the complementary cell 10C includes the resistive memory element 10A and the resistive memory element 10B. In this embodiment, the write circuit 21 that writes data into the resistive memory element 10A is provided, and the write circuit 22 that writes data into the resistive memory element 10B is provided. That is, the resistive memory elements (10A and 10B) in the complementary cell are respectively provided with the write circuit (21 or 22).

As for the write circuit 21, a bit line $BL_1$ is connected to the source of the NMOS transistor 30a, and a bit line BLb is electrically connected to the fixed magnetization layer 10a of the resistive memory element 10A and the free magnetization layer 10c of the resistive memory element 10B.

As for the write circuit 22, a bit line $BL_2$ is connected to the source of the NMOS transistor 30b. The bit line BLb of the write circuit 22 is common to the bit line BLb of the write circuit 21.

The word line WL is connected to the gate of the NMOS transistor 30a and the gate of the NMOS transistor 30b. The word line WL is electrically connected to the control unit 40.

The drain of the NMOS transistor 30a is electrically connected to the free magnetization layer 10c of the resistive memory element 10A. The drain of the NMOS transistor 30b is electrically connected to the fixed magnetization layer 10a of the resistive memory element 10B.

Next, an example of the data write circuit of the resistive memory element shown in FIG. 2 is described with reference to FIGS. 3, 4 and the like. In detail, (a) of FIG. 3 is a conceptual diagram showing the state of ($R_Y$, $R_{Yb}$)=($R_1$, $R_0$), (b) of FIG. 3 is a conceptual diagram showing the state of ($R_Y$, $R_{Yb}$)=($R_0$, $R_1$), (c) of FIG. 3 shows current $I_{WY}$ flowing into the resistive memory element 10A on the left shown in FIG. 2, and (d) of FIG. 3 shows current $I_{WYb}$ flowing through the resistive memory element 10B on the right shown in FIG. 2.

Figure 3:
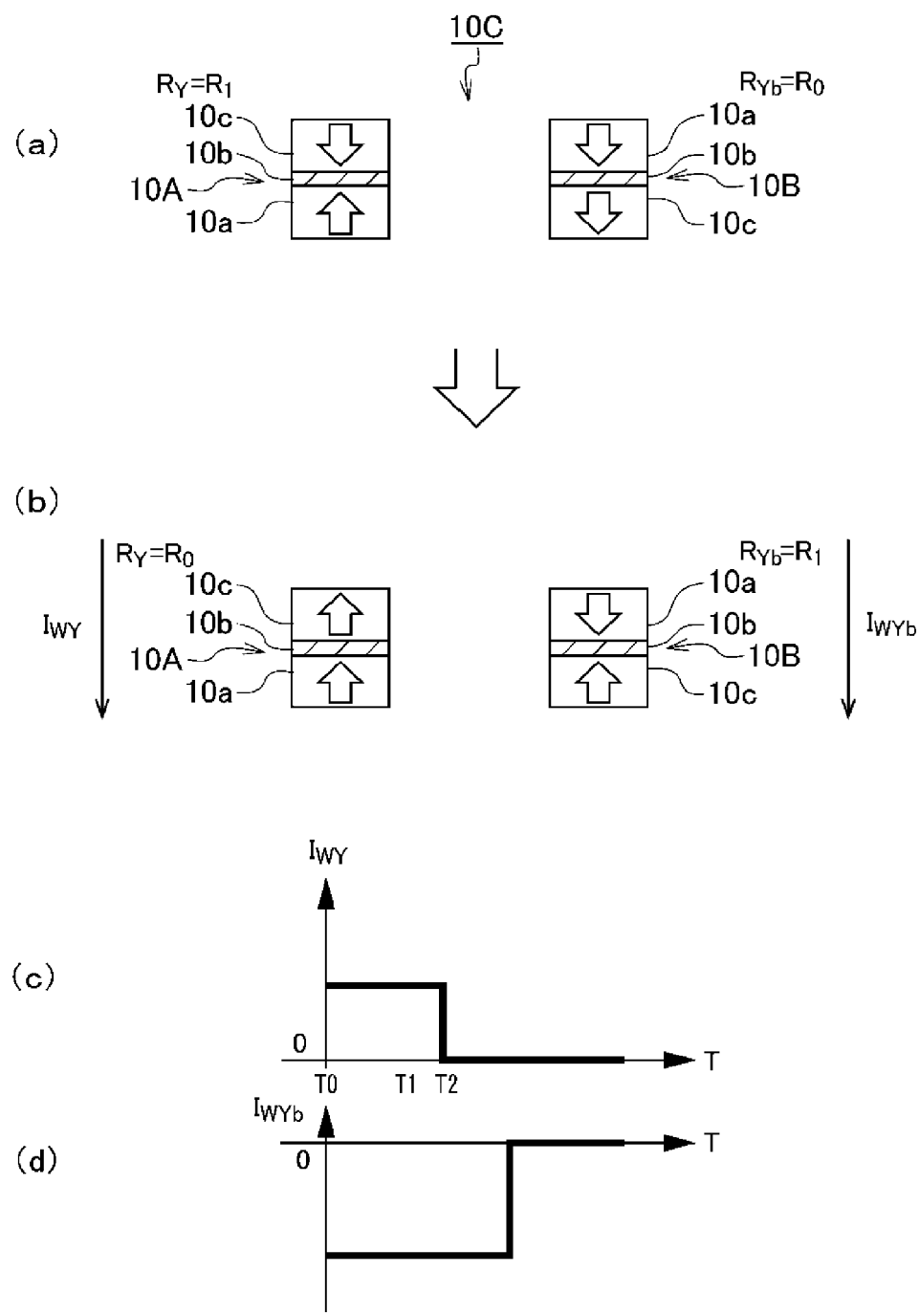
FIG. 3 shows an example of writing Y=0 in the data write circuit of the resistive memory element shown in FIG. 2, (a) shows a case where the state of the complementary cell is $(R_Y, R_{Yb})=(R_1, R_0)$, (b) shows a case where the state of the complementary cell is $(R_Y, R_{Yb})=(R_0, R_1)$, (c) shows current $I_{WY}$, and (d) shows current $I_{WYb}$.

On the ordinate axes of (c) and (d) of FIG. 3, the direction of current flowing from the free magnetization layer 10c to the fixed magnetization layer 10a of each resistive memory element is defined to be positive.

In the initial state, as shown in (a) of FIG. 3, the resistive memory elements 10A and 10B are in the state of $(R_Y, R_{Yb})=(R_1, R_0)$. That is, the complementary cell 10C is in the state of Y=1.

At the time T0, the write circuits 21 and 22 perform control such that the word line WL can be set to a high level, the current $I_{WY}$ equal to or higher than a threshold can flow through the resistive memory element 10A, and the current $I_{WYb}$ equal to or higher than a threshold can flow through the resistive memory element 10B.

The resistive memory elements have variation in writing characteristics.

In this embodiment, at the time T1, writing into the resistive memory element 10A is finished. In detail, the resistive memory element 10A transits from the state of $R_Y=R_1$ shown in (a) of FIG. 3 to the state of $R_Y=R_0$ shown in (b) of FIG. 3. Then, at the time T2, writing into the resistive memory element 10B is finished. In detail, the resistive memory element 10B transits from the state of $R_Y=R_0$ shown in (a) of FIG. 3 to the state of $R_Y=R_1$ shown in (b) of FIG. 3. That is, the resistive memory elements 10A and 10B become the state of $(R_Y, R_{Yb})=(R_0, R_1)$. That is, the complementary cell 10C transits to the state of Y=0. When the writing operation is finished, the word line WL is set to an L level.

Next, a writing operation of the complementary cell 10C from Y=0 (initial state) to Y=1 is described. In detail, (a) of FIG. 4 is a conceptual diagram showing the state of $(R_Y, R_{Yb})=(R_1, R_0)$, (b) of FIG. 4 is a conceptual diagram showing the state of $(R_Y, R_{Yb})=(R_0, R_1)$, (c) of FIG. 4 shows current $I_{WY}$ flowing into the resistive memory element 10A on the left shown in FIG. 2, and (d) of FIG. 4 shows current $I_{WYb}$ flowing through the resistive memory element 10B on the right shown in FIG. 2.

Figure 4:
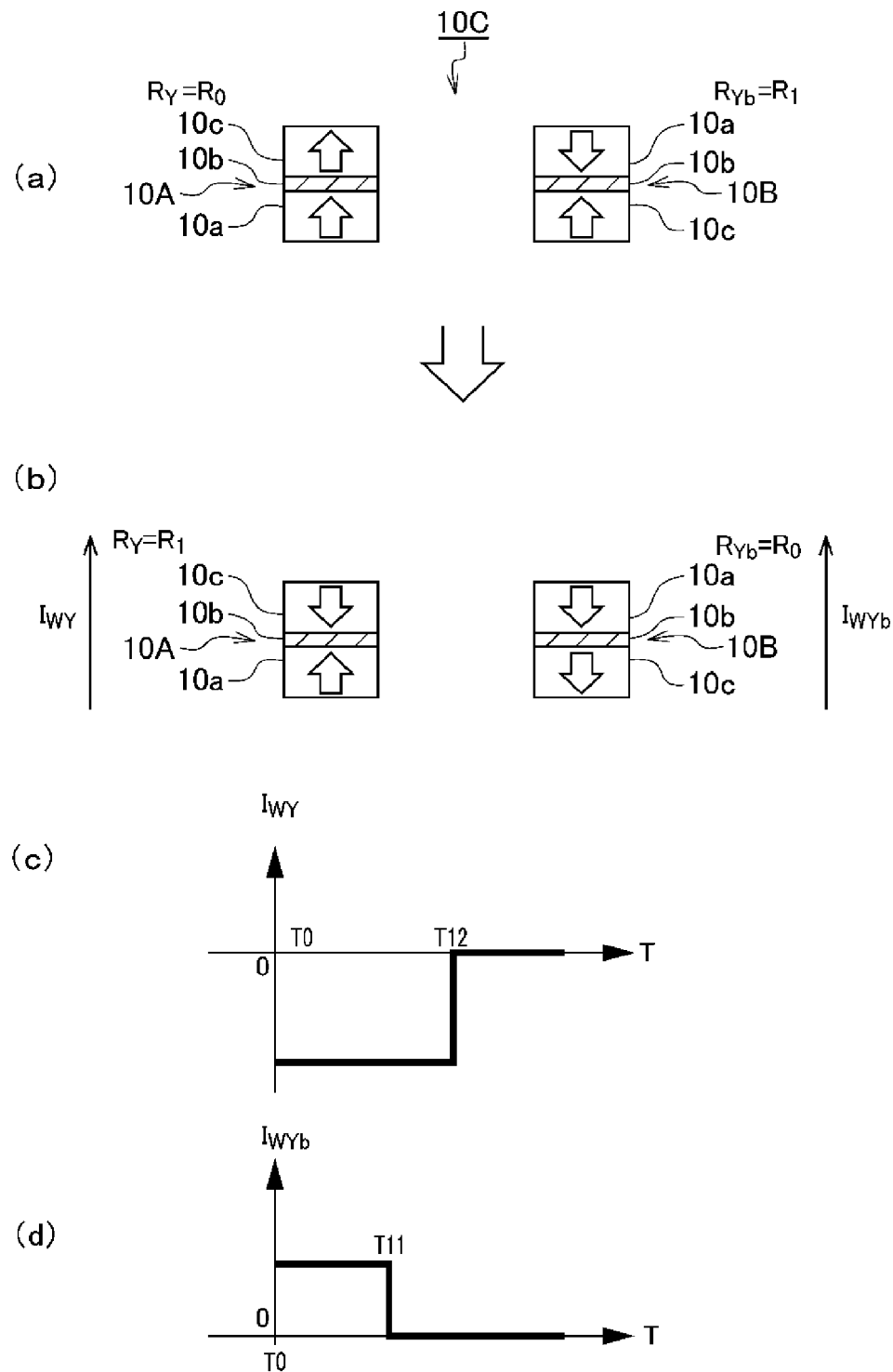
FIG. 4 shows an example of writing Y=1 in the data write circuit of the resistive memory element shown in FIG. 2, (a) shows a case where the state of the complementary cell is $(R_Y, R_{Yb})=(R_0, R_1)$, (b) shows a case where the state of the complementary cell is $(R_Y, R_{Yb})=(R_1, R_0)$, (c) shows current $I_{WY}$, and (d) shows current $I_{WYb}$.

On the ordinate axes of (c) and (d) of FIG. 4, the direction of current flowing from the free magnetization layer 10c to the fixed magnetization layer 10a of each resistive memory element is defined to be positive.

In the initial state, as shown in (a) of FIG. 4, the resistive memory elements 10A and 10B are in the state of $(R_Y, R_{Yb})=(R_0, R_1)$.

At the time T0, the write circuits 21 and 22 perform control such that the word line WL can be set to a high level, the current $I_{WY}$ equal to or higher than a threshold can flow through the resistive memory element 10A, and the current $I_{WYb}$ equal to or higher than a threshold can flow through the resistive memory element 10B.

In this embodiment, at the time T11, writing into the resistive memory element 10B is finished. In detail, the resistive memory element 10B transits from the state of $R_Y=R_1$ shown in (a) of FIG. 4 to the state of $R_Y=R_0$ shown in (b) of FIG. 4. Then, at the time T12, writing into the resistive memory element 10A is finished. In detail, the resistive memory element 10A transits from the state of $R_Y=R_0$ shown in (a) of FIG. 4 to the state of $R_Y=R_1$ shown in (b) of FIG. 4. That is, the resistive memory elements 10A and 10B come into the state of $(R_Y, R_{Yb})=(R_1, R_0)$. That is, the complementary cell 10C becomes the state of Y=1.

That is, in this embodiment, the data write circuit of the resistive memory element includes the two write circuits 21 and 22, which write data into the respective resistive memory elements 10A and 10B of the complementary cell 10C. Consequently, the writing operation can be performed at high speed.

As described above, the data write circuit of the resistive memory element according to the embodiment of the present invention includes: the complementary resistive memory element (complementary cell 10C) that includes the resistive memory elements 10A and 10B; the writing means (write circuit) for making the complementary resistive memory element cause a resistance change; the detection means (detection unit 30) for detecting a writing state in the complementary resistive memory element (complementary cell 10C); and the control means (control unit 40). The control means (control unit 40) controls writing completion by the writing means (write circuit), based on the detected signal of the detection means (detection unit 30). For example, when completion of writing is detected by the detection unit 30, the control unit 40 stops applying write current by the writing means (write circuits), and finishes writing.

In the data write circuit of the resistive memory element according to this embodiment, the writing means (write circuits) includes the writing units (write circuits 21 and 22) corresponding to the respective memory elements (resistive memory elements 10A and 10B) of the complementary resistive memory element (complementary cell 10C). Writing is simultaneously performed by the writing units (write circuits 21 and 22) into the respective memory elements (resistive memory elements 10A and 10B) so as to cause resistance changes opposite to each other. The control means (control unit 40) performs the writing control of the memory elements (resistive memory elements 10A and 10B) on the basis of the writing states of the respective memory elements (resistive memory elements 10A and 10B) by the detection means (detection unit 30).

That is, writing is simultaneously performed by the write circuit 21 and the write circuit 22 into the respective resistive memory elements 10A and 10B of the complementary cell 10C, thereby allowing the writing process to be performed at high speed with a simple configuration.

Second Embodiment: Type2

Figure 5:
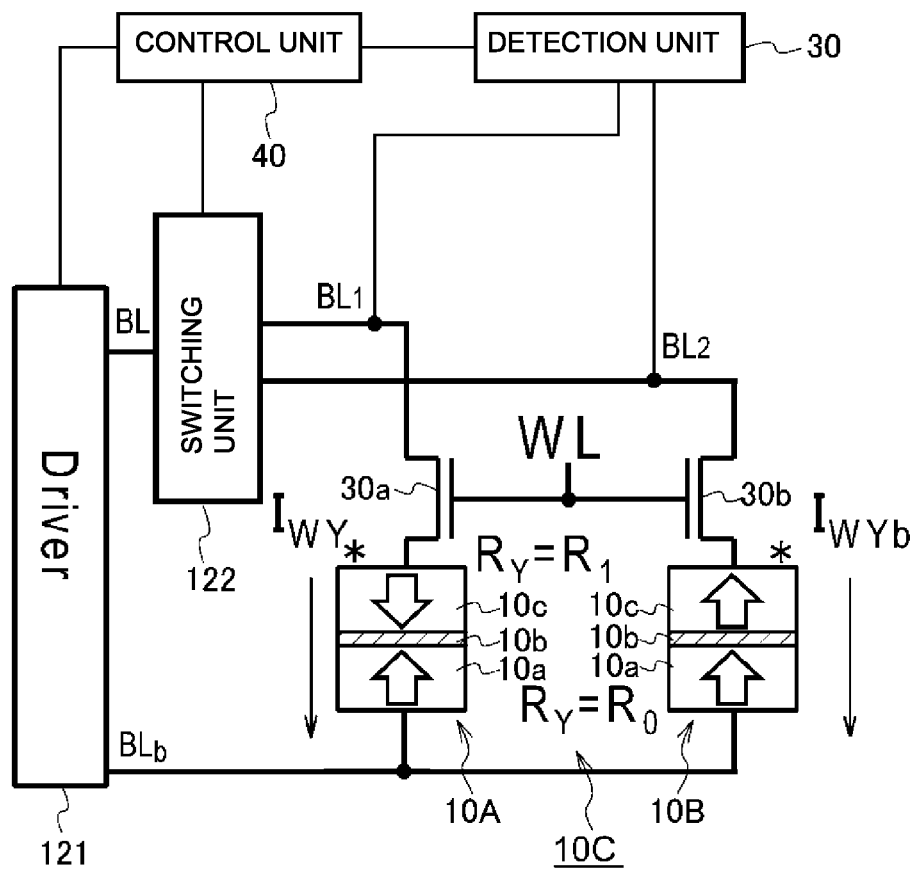
FIG. 5 shows a configuration example of a data write circuit of a resistive memory element according to a second embodiment of the present invention.

FIG. 5 shows a configuration example of a data write circuit of a resistive memory element according to a second embodiment of the present invention.

In the data write circuit of the resistive memory element shown in FIG. 5, the writing means includes: a write circuit 121; and switching means (switching unit 122) for performing writing so as to make the writing complementary resistive memory elements (10A and 10B) respectively and sequentially cause resistance changes opposite to each other. In detail, the write circuit 121 and the switching unit 122 are included as the writing means. That is, in this embodiment, the write circuit includes one write circuit 121. Control of writing a writing signal from the write circuit 121 by the switching unit 122 into one of the resistive memory elements 10A and 10B and of subsequently writing into the other resistive memory element is performed.

As shown in FIG. 5, as for the write circuit 121, the bit line BL is connected to the switching unit 122, and the bit line BLb is electrically connected to the fixed magnetization layers 10a of the resistive memory element 10A and the resistive memory element 10B.

The bit line BL1 from the switching unit 122 is connected to the source of the NMOS transistor 30a. The bit line BL2 from the switching unit 122 is connected to the source of the NMOS transistor 30b.

The word line WL is connected to the gate of the NMOS transistor 30a and the gate of the NMOS transistor 30b. The word line WL is electrically connected to the control unit 40.

The drain of the NMOS transistor 30a is electrically connected to the free magnetization layer 10c of the resistive memory element 10A. The drain of the NMOS transistor 30b is electrically connected to the free magnetization layer 10c of the resistive memory element 10B.

Next, an example of the data write circuit of the resistive memory element shown in FIG. 5 is described with reference to FIGS. 6 and 7. In detail, (a) of FIG. 6 is a conceptual diagram showing the state of $(R_Y, R_{Yb})=(R_1, R_0)$, (b) of FIG. 6 is a conceptual diagram showing the state of $(R_Y, R_{Yb})=(R_0, R_0)$, and (c) of FIG. 6 is a conceptual diagram showing the state of $(R_Y, R_{Yb})=(R_0, R_1)$.

Figure 6:
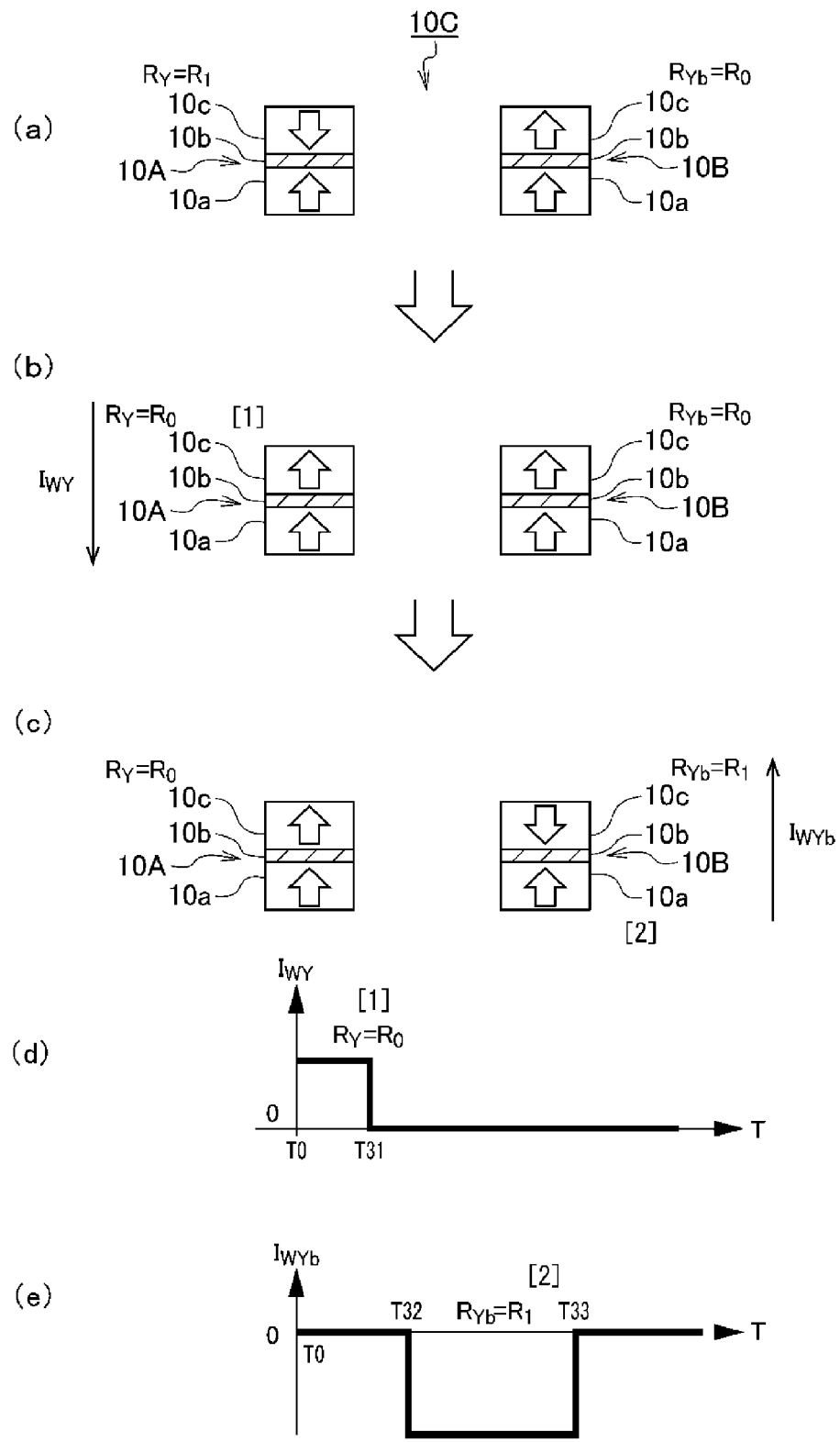
FIG. 6 shows an example of the data write circuit of the resistive memory element shown in FIG. 5, (a) shows a case where the state of the complementary cell is $(R_Y, R_{Yb})=(R_1, R_0)$, (b) shows a case where the state of the complementary cell is $(R_Y, R_{Yb})=(R_0, R_0)$, (c) shows a case where the state of the complementary cell is $(R_Y, R_{Yb})=(R_0, R_1)$, (d) shows current $I_{WY}$ flowing through the resistive memory element on the left shown in FIG. 5, and (e) shows current $I_{WYb}$ flowing through the resistive memory element on the right shown in FIG. 5.

Section (d) of FIG. 6 shows current $I_{WY}$ flowing through the resistive memory element 10A on the left shown in FIG. 5, and (e) of FIG. 6 shows current $I_{WYb}$ flowing through the resistive memory element 10B on the right shown in FIG. 5. On the ordinate axes of (d) and (e) of FIG. 6, the direction of current flowing from the free magnetization layer 10c to the fixed magnetization layer 10a of each resistive memory element is defined to be positive.

In the initial state, as shown in (a) of FIG. 6, the resistive memory elements 10A and 10B are in the state of $(R_Y, R_{Yb})=(R_1, R_0)$. That is, the complementary cell 10C is in the state of Y=1.

At the time T0, the write circuit 121 and the switching unit 122 perform control such that the word line WL can be set to a high level, the current $I_{WY}$ equal to or higher than a threshold can flow through the resistive memory element 10A.

At the time T31, the resistive memory element 10A transits from the state of $R_Y=R_1$ shown in (a) of FIG. 6 to the state of $R_Y=R_0$ shown in (b) of FIG. 6, and writing into the resistive memory element 10A is finished ([1] state in (b) of FIG. 6 and [1] state in (d) of FIG. 6).

The resistive memory elements have variation in writing characteristics. In detail, the resistive memory elements have variation in writing completion time. Accordingly, after the longest assumed writing completion time of the resistive memory element 10A has elapsed, at the time T32, writing into the resistive memory element 10B is started.

At the time T32, the write circuit 121 and the switching unit 122 perform control such that the current $I_{WYb}$ equal to or higher than a threshold can flow through the resistive memory element 10B.

At the time T33, writing into the resistive memory element 10B is finished. In detail, the resistive memory element 10B transits from the state of $R_{Yb}=R_0$ shown in (b) of FIG. 6 to the state of $R_{Yb}=R_1$ shown in (c) of FIG. 6. That is, the resistive memory elements 10A and 10B come into the state of $(R_Y, R_{Yb})=(R_0, R_1)$ ([2] state in (c) of FIG. 6 and [2] state in (e) of FIG. 6). That is, the complementary cell 10C transits to the state of Y=0. When the writing operation is finished, the word line WL is set to an L level.

Next, a writing operation of the complementary cell 10C from Y=0 (initial state) to Y=1 is described. In detail, (a) of FIG. 7 is a conceptual diagram showing the state of $(R_Y, R_{Yb})=(R_0, R_1)$, (b) of FIG. 7 is a conceptual diagram showing the state of $(R_Y, R_{Yb})=(R_1, R_1)$, and (c) of FIG. 7 is a conceptual diagram showing the state of $(R_Y, R_{Yb})=(R_1, R_0)$.

Figure 7:
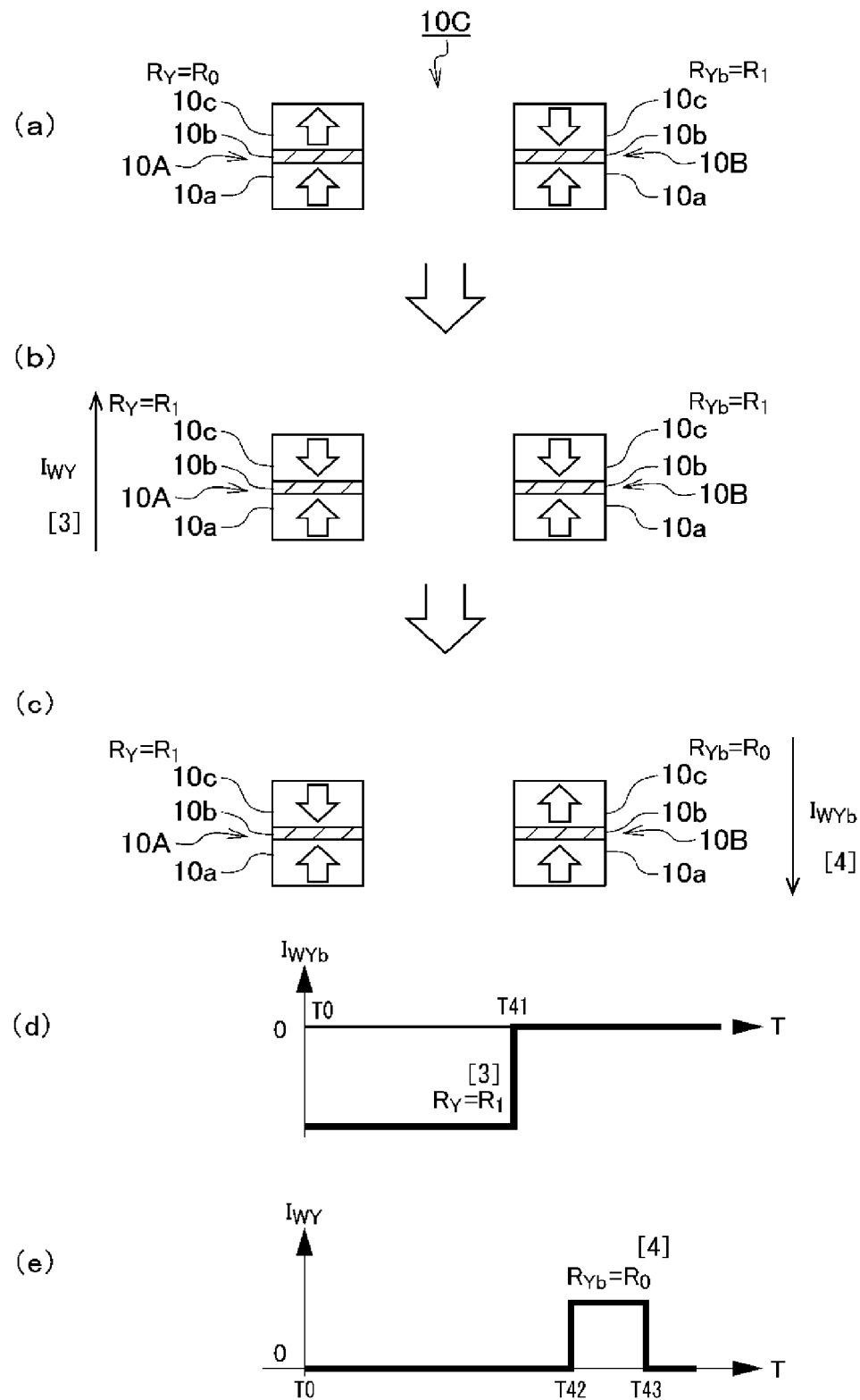
FIG. 7 shows an example of the data write circuit of the resistive memory element shown in FIG. 5, (a) shows a case where the state of the complementary cell is $(R_Y, R_{Yb})=(R_0, R_1)$, (b) shows a case where the state of the complementary cell is $(R_Y, R_{Yb})=(R_1, R_1)$, (c) shows a case where the state of the complementary cell is $(R_Y, R_{Yb})=(R_1, R_0)$, (d) shows current $I_{WY}$ flowing through the resistive memory element on the left shown in FIG. 5, and (e) shows current $I_{WYb}$ flowing through the resistive memory element 10B on the right shown in FIG. 5.

Section (d) of FIG. 7 shows current $I_{WY}$ flowing through the resistive memory element 10A on the left shown in FIG. 5, and (e) of FIG. 7 shows current $I_{WYb}$ flowing through the resistive memory element 10B on the right shown in FIG. 5. On the ordinate axes of (d) and (e) of FIG. 7, the direction of current flowing from the free magnetization layer 10c to the fixed magnetization layer 10a of each resistive memory element is defined to be positive.

At the time T0, the write circuit 121 and the switching unit 122 perform control such that the word line WL can be set to a high level, the current $I_{WY}$ equal to or higher than a threshold can flow through the resistive memory element 10A.

At the time T41, the resistive memory element 10A transits from the state of $R_Y=R_0$ shown in (a) of FIG. 7 to the state of $R_Y=R_1$ shown in (b) of FIG. 7, and writing into the resistive memory element 10A is finished ([3] state in (b) of FIG. 7 and [3] state in (d) of FIG. 7). The resistive memory elements have variation in writing completion time. Accordingly, after the longest assumed writing completion time of the resistive memory element 10A has elapsed, at the time T42, writing into the resistive memory element 10B is started.

At the time T42, the write circuit 121 and the switching unit 122 perform control such that the current $I_{WYb}$ equal to or higher than a threshold can flow through the resistive memory element 10B.

At the time T43, writing into the resistive memory element 10B is finished. In detail, the resistive memory element 10B transits from the state of $R_Y=R_1$ shown in (b) of FIG. 7 to the state of $R_Y=R_0$ shown in (c) of FIG. 7. That is, the resistive memory elements 10A and 10B come into the state of $(R_Y, R_{Yb})=(R_1, R_0)$ ([4] state in (c) of FIG. 7 and [4] state in (e) of FIG. 7). That is, the complementary cell 10C becomes the state of Y=1. When the writing operation is finished, the word line WL is set to an L level.

As described above, the data write circuit of the resistive memory element according to the second embodiment of the present invention includes: the complementary resistive memory element (complementary cell 10C) that includes the resistive memory elements 10A and 10B; the writing means (write circuit 121) for making the complementary resistive memory element cause a resistance change; the detection means (detecting unit 30) for detecting a writing state in the complementary resistive memory element (complementary cell 10C); and the control means (control unit 40) for controlling writing completion of the writing means (write circuit 121) on the basis of the detected signal of the detection means (detection unit 30).

The writing means (write circuit 121) includes the switching means (switching unit 122) for performing writing so as to make the resistive memory elements 10A and 10B of the complementary resistive memory element (complementary cell 10C) respectively and sequentially cause resistance changes opposite to each other.

That is, the data write circuit of the resistive memory element of the second embodiment can perform writing while switching the writing target to one or the other of the resistive memory elements 10A and 10B of the complementary cell 10C by the switching unit 122. Accordingly, the write circuit is allowed to have a single circuit configuration. In comparison with the data write circuit including the two write circuits of the first embodiment, the number of configuration elements, such as transistors, can be reduced, and the total circuit scale can be reduced.

Third Embodiment: Type3

FIG. 8 is a diagram for illustrating a data write circuit of a resistive memory element according to a third embodiment of the present invention. In detail, (a) of FIG. 8 is a conceptual diagram of the data write circuit of the resistive memory element. Section (b) of FIG. 8 is a timing chart for illustrating an example of the data write circuit of the resistive memory element shown in (a) of FIG. 8.

The data write circuit shown in (a) of FIG. 8 includes a complementary cell 10C, a write circuit 20, a detection unit 30, and a control unit 40.

The complementary cell 10C includes two of resistive memory element 10A and resistive memory element 10B. The state of the resistive memory element 10A is indicated by Y, and the state of the resistive memory element 10B is indicated by Yb.

A writing data signal A is applied to the write circuit 20. A writing signal WCK (clock for writing) is applied to the write circuit 20.

The write circuit 20 and the complementary cell 10C are electrically connected to each other by a bit line BL, a bit line BLb and a word line WL. In detail, the bit line BL is electrically connected to the source of an NMOS transistor 30a, and the drain of the NMOS transistor 30a is electrically connected to the free magnetization layer 10c side of the resistive memory element 10A.

The bit line BLb is electrically connected to the source of an NMOS transistor 30b, and the drain of the NMOS transistor 30b is electrically connected to the free magnetization layer 10c side of the resistive memory element 10B.

The word line (WL) is electrically connected to the source of the NMOS transistor 30a and the source of the NMOS transistor 30b.

In this embodiment, the write circuit 20 includes switching means (switching unit 50) for applying current through the series-connected resistive memory elements (10A and 10B) of the complementary resistive element (complementary cell 10C) and for switching the direction in which the current flows.

The detection unit 30 detects the writing state (write circuit 20) of the complementary resistive memory element (complementary cell 10C). In detail, the detection unit 30 detects the voltage of the bit line BL and the voltage of the bit line BLb, and outputs the detected signal to the control unit 40.

The control unit 40 controls writing completion of the writing means (write circuit 20), based on the detected signal of the detection means (detection unit 30).

An example of the data write circuit of the resistive memory element shown in (a) of FIG. 8 is described. First, the writing operation in a case of data A of '0' is described. In the initial state, (Y, Yb)=(1, 0) is satisfied.

At the time T51, the writing clock signal WCK is set to the H level (WCK=1), and the write circuit 20 is set to a writing mode. The word line WL is set to the H level. Setting is made so as to apply current from the bit line BL to the bit line BLb. At this time, variation in voltage on the bit line BL side is monitored.

At the time T52, first, Y=0 is written into the resistive memory element 10A (MTJ device) on the left, and (Y, Yb)=(0, 0) is achieved. The resistance value of the write path decreases, and the current $I_W$ from the fixed magnetization layer side of the resistive memory element 10A to the fixed magnetization layer side of the resistive memory element 10B increases. Then, the voltage of the bit line BL transits from $V_H$ to $V_L$ ($V_H > V_L$).

At the time T53, the state of Y=1 is written into the resistive memory element 10B (MTJ device) on the right, and (Y, Yb)=(0, 1) is achieved. The resistance value of the write path increases, and $I_W$ decreases. The voltage of the bit line BL transits from $V_L$ to $V_H$. Then, upon detection of two times of the writing completion at the time T52 and time T53, the word line WL transits to the L level (WL=0), and the writing operation is stopped.

Next, the writing operation in the case of data A of '1' is described. In the initial state, (Y, Yb)=(0, 1) is satisfied. Note that the timing chart is omitted.

At the time T51, the writing clock signal WCK is set to the H level (WCK=1), and the write circuit 20 is set to the writing mode. The word line WL is set to the H level. Setting is made so as to apply current from the bit line BLb to the bit line BL. At this time, the voltage change on the bit line BLb side is monitored.

At the time T52, Y=0 is written into the resistive memory element 10B (MTJ device) on the right, and (Y, Yb)=(0, 0) is achieved. The resistance value of the write path decreases, and the current $I_W$ from the fixed magnetization layer side of the resistive memory element 10A to the fixed magnetization layer side of the resistive memory element 10B increases. Then, the voltage of the bit line BLb transits from $V_H$ to $V_L$ ($V_H > V_L$).

At the time T53, the state of Y=1 is written into the resistive memory element 10A (MTJ device) on the left, and (Y, Yb)=(1, 0) is achieved. At this time, the resistance value of the write path increases, and $I_W$ decreases. The voltage of the bit line BLb transits from $V_L$ to $V_H$. Then, upon detection of two times of the writing completion at the time T52 and time T53, the word line WL transits to the L level (WL=0), and the writing operation is stopped.

Next, the data write circuit of the resistive memory element according to an example of the embodiment shown in FIG. 8 is described with reference to FIGS. 9 to 12.

Figure 9:
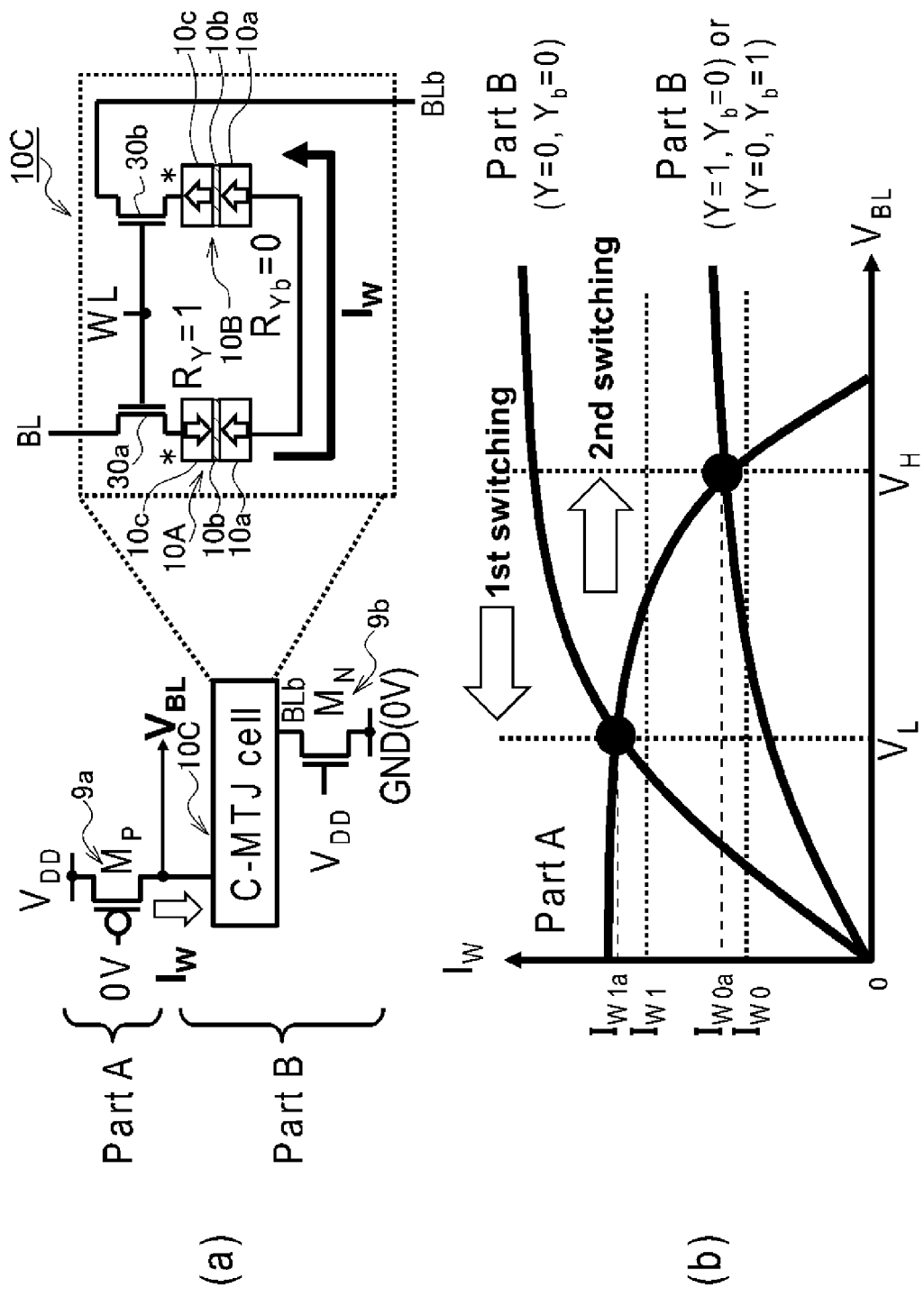
FIG. 9 shows a diagram for illustrating the data write circuit of the resistive memory element according to an example of the embodiment shown in FIG. 8, (a) shows an configuration example, and (b) shows a load characteristic curve and a voltage-current characteristic curve of the data write circuit of the resistive memory element shown in (a)

As shown in (a) of FIG. 9, the data write circuit of the resistive memory element of this example is divided into an A part (Part A) and a B part (Part B) with the output terminal intervening therebetween. The data write circuit includes a PMOS transistor 9a ($M_p$) as the A part (Part A), and includes a complementary cell 10C and an NMOS transistor 9b ($M_N$) as the B part (Part B). That is, the A part (Part A) is a part corresponding to the PMOS transistor 9a, and serves as a load resistor.

Note that (a) of FIG. 9 only shows the configuration of detecting the voltage of the bit line BL as the A part (Part A) and the configuration of grounding the bit line BLb as the B part (Part B) in the data write circuit, with the configuration of detecting the voltage of the bit line BLb as the A part (Part A) and the configuration of grounding the bit line BL as the B part (Part B) being omitted.

Hereinafter, the configuration of detecting the voltage $V_{BL}$ of the bit line BL shown in (a) of FIG. 9 is described.

As for the PMOS transistor 9a ($M_p$), the source is connected to a power supply voltage $V_{DD}$, and the drain is electrically connected to the complementary cell 10C via the bit line BL. The connection node between the transistor 9a and the complementary cell 10C is an output terminal for outputting the voltage $V_{BL}$, and is connected to the detection unit 30 (see FIG. 8). The control gate of the PMOS transistor 9a ($M_p$) is connected to a reference voltage (0 V) by control by the control unit, as required.

As for the NMOS transistor 9b ($M_N$), the source is connected to the complementary cell 10C via the bit line BLb, and the drain is grounded to the reference voltage GND (0 V). The control gate of the NMOS transistor 9b ($M_N$) is connected to the power supply voltage $V_{DD}$, by the control unit, as required.

The complementary cell 10C includes two of resistive memory element 10A and resistive memory element 10B. As described above, the resistive memory elements 10A and 10B are provided with the tunnel barrier layer 10b between the fixed magnetization layer 10a and the free magnetization layer 10c. The bit line BL is electrically connected to the source of an NMOS transistor 30*a*, and the drain of the NMOS transistor 30*a* is electrically connected to the free magnetization layer 10*c* side of the resistive memory element 10A. The bit line BLb is electrically connected to the source of an NMOS transistor 30*b*, and the drain of the NMOS transistor 30*b* is electrically connected to the free magnetization layer 10*c* side of the resistive memory element 10B. The control sources of the NMOS transistors 30*a* and 30*b* are connected to the word line WL.

Section (b) of FIG. 9 shows the load characteristic curve and the voltage-current characteristic curve of the data write circuit of the resistive memory element shown in (a) of FIG. 9. The common current $I_W$ flows through the A part (Part A) and the B part (Part B) shown in (a) of FIG. 9. Accordingly, the voltage of the output terminal of $V_{BL}$ is the voltage at the intersection where the curve of the load characteristics of the A part (Part A) and the voltage-current characteristic curve of the B part (Part B). In detail, (b) of FIG. 9 shows the curve of the load characteristics of the A part (Part A), and the voltage-current characteristic curve of the B part (Part B).

The voltage-current characteristic curve of the B part (Part B) shows a case where the states of the written resistive memory elements 10A and 10B of the complementary cell 10C are (Y=0 and Yb=0) (low resistance), (Y=1 and Yb=0), or (Y=0 and Yb=1) (high resistance).

If the states of the resistive memory elements 10A and 10B of the complementary cell 10C are (Y=0 and Yb=0) (low resistance), the voltage of the output terminal of $V_{BL}$ is the voltage $V_L$ at the intersection where the curve of the load characteristics of the A part (Part A) and the voltage-current characteristic curve of the B part (Part B). The current $I_W$ flowing through the A part (Part A) and the B part (Part B) has a current value $I_{W1a}$. The current value $I_{W1a}$ is set to current $I_{W1}+I\alpha$ equal to or higher than a current threshold ($I_{W1}$) required to cause the resistive memory element to transition from the low resistance state ($R_Y=R_0$) to the high resistance state ($R_Y=R_1$). I$\alpha$ is a slight current value.

When the states of the resistive memory elements 10A and 10B of the complementary cell 10C are (Y=1 and Yb=0) or (Y=0 and Yb=1) (high resistance), the voltage of the output terminal of $V_{BL}$ is the voltage $V_H$ at the intersection where the curve of the load characteristics of the A part (Part A) and the voltage-current characteristic curve of the B part (Part B). The current $I_W$ flowing through the A part (Part A) and the B part (Part B) has a current value $I_{W0a}$. The current value $I_{W0a}$ is set to current $I_{W0}+I\beta$ equal to or higher than a current threshold ($I_{W0}$) required to cause the resistive memory element to transition from the high resistance state ($R_Y=R_1$) to the low resistance state ($R_Y=R_0$). I$\beta$ is a slight current value. I$\beta$ may be a current value identical to or different from I$\alpha$.

The detection unit can determine the writing states of the resistive memory elements 10A and 10B according to whether the voltage $V_{BL}$ of the connection node is the voltage $V_H$ or the voltage $V_L$.

Figure 10:
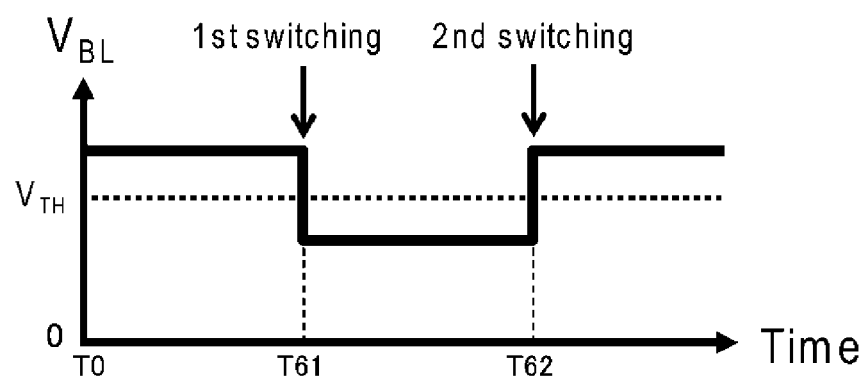
FIG. 10 shows an example of a voltage $V_{BL}$ in a writing operation of the data write circuit of the resistive memory element shown in FIG. 9.

FIG. 10 shows an example of the voltage $V_{BL}$ in the writing operation of the data write circuit of the resistive memory element shown in FIG. 9. The detection unit 30 (see FIG. 8) includes a sense amplifier, which detects the voltage $V_{BL}$ of the connection node.

At the time T0, when the voltage $V_{BL}$ has a voltage level equal to or higher than the predefined threshold $V_{TH}$, the states of the resistive memory elements of the complementary cell 10C are detected as (Y=1 and Yb=0) or (Y=0 and Yb=1).

When the voltage $V_{BL}$ transits from the voltage level equal to or higher than the threshold $V_{TH}$ to the voltage level less than the threshold $V_{TH}$ at the time T61 that is the timing of 1st switching, the states of the resistive memory elements of the complementary cell 10C are detected to be (Y=0 and Yb=0).

When the voltage $V_{BL}$ transits from the voltage level less than the threshold $V_{TH}$ to the voltage level equal to or higher than the threshold $V_{TH}$ at the time T62 that is the timing of 2nd switching, the states of the resistive memory elements of the complementary cell 10C are detected to be (Y=1 and Yb=0) or (Y=0 and Yb=1).

Next, an example of the data write circuit of the resistive memory element shown in FIG. 9 is described with reference to FIGS. 11 and 12 and the like.

Figure 11:
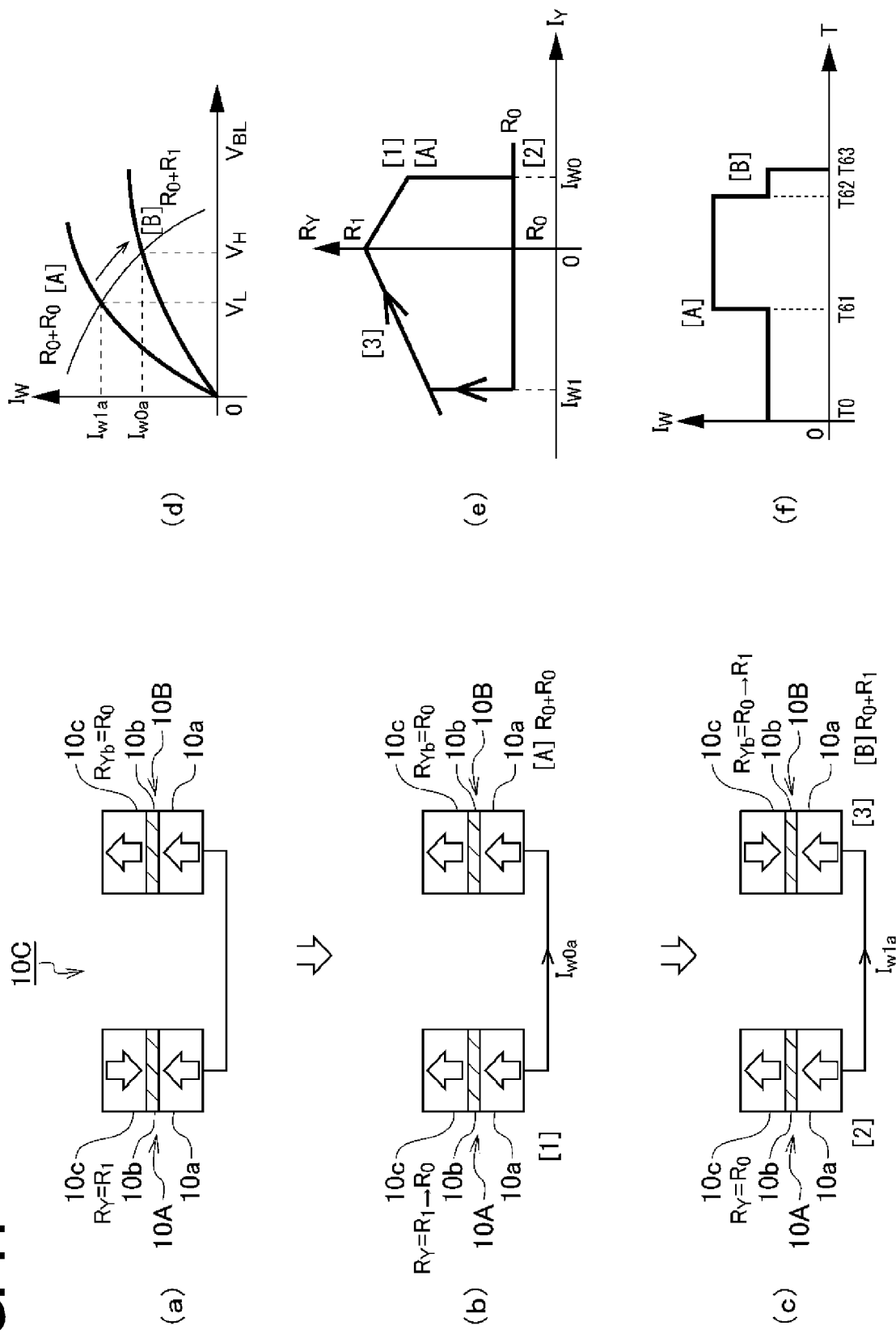
FIG. 11 shows an example of the data write circuit shown in FIG. 9 writing Y=0 in a complementary cell 10C, (a) shows a case where the state of the complementary cell is $(R_Y, R_{Yb})=(R_1, R_0)$, (b) shows a case where the state of the complementary cell is $(R_Y, R_{Yb})=(R_0, R_0)$, (c) shows a case where the state of the complementary cell is $(R_Y, R_{Yb})=(R_0, R_1)$, (d) shows a load characteristic curve and a voltage-current characteristic curve of the data write circuit, (e) shows an example of a resistance-voltage characteristics of a resistive memory element, and (f) shows an example of current flowing through the complementary cell of the data write circuit.

FIG. 11 shows an example of the data write circuit shown in FIG. 9 writing Y=0 into the complementary cell 10C. In detail, (a) of FIG. 11 shows a case where the state of the complementary cell is ($R_Y$, $R_{Yb}$)=($R_1$, $R_0$), (b) of FIG. 11 shows a case where the state of the complementary cell is ($R_Y$, $R_{Yb}$)=($R_0$, $R_0$), and (c) of FIG. 11 shows a state where the state of the complementary cell is ($R_Y$, $R_{Yb}$)=($R_0$, $R_1$).

Section (d) of FIG. 11 shows the load characteristic curve and the voltage-current characteristic curve of the data write circuit, (e) of FIG. 11 shows an example of the resistance-voltage characteristics of the resistive memory element, and (f) of FIG. 11 shows an example of current flowing through the complementary cell of the data write circuit.

As shown in (a) of FIG. 11, in the initial state, the state of the complementary cell 10C is ($R_Y$, $R_{Yb}$)=($R_1$, $R_0$) (Y=1). The resistance value of the complementary cell 10C is $R_1+R_0$.

At the time T0, the write circuit sets the bit line voltage $V_{BL}$ to $V_H$, and the current $I_{W0a}$ flows through the complementary cell 10C.

At the time T61, as shown in (b) of FIG. 11, the sense of the magnetization of the free magnetization layer of the resistive memory element 10A is reversed, the low resistance state $R_Y=R_0$ is achieved (transition from [1] state to [2] state in (e) of FIG. 11), the complementary cell 10C transits to ($R_Y$, $R_{Yb}$)=($R_0$, $R_0$), the resistance value of the complementary cell 10C transits to $R_0+R_0$, the bit line voltage $V_{BL}$ transits to $V_L$, and the current $I_{W1a}$ flows ([A] state in (f) of FIG. 11, and [A] state in (d) of FIG. 11).

At the time T62, as shown in (c) of FIG. 11, the sense of the magnetization of the free magnetization layer of the resistive memory element 10B is reversed, the high resistance state $R_{Yb}=R_1$ is achieved ([3] state in (e) of FIG. 11), the complementary cell 10C transits to ($R_Y$, $R_{Yb}$)=($R_0$, $R_1$), the resistance value of the complementary cell 10C transits to $R_0+R_1$, the bit line voltage $V_{BL}$ transits to $V_H$, and the current $I_{W0a}$ flows ([B] state in (f) of FIG. 11, and [B] state in (d) of FIG. 11).

At the time T63, when the writing operation is finished, the word line WL transits to the L level, and the current $I_W$ transits to 0 as shown in (f) of FIG. 11.

Figure 12:
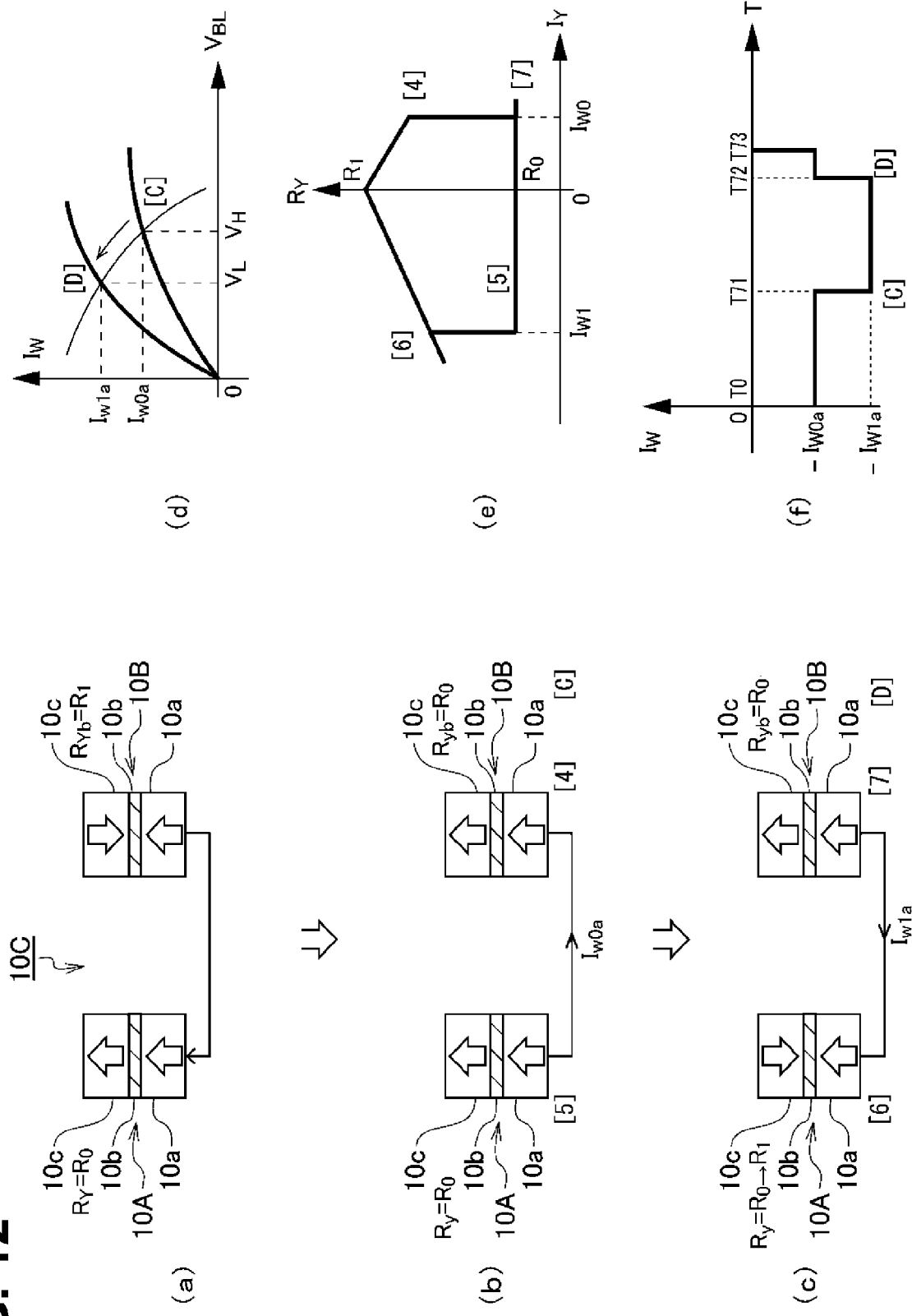
FIG. 12 shows an example of the data write circuit shown in FIG. 9 writing Y=1 in a complementary cell, (a) shows a case where the state of the complementary cell is $(R_Y, R_{Yb})=(R_0, R_1)$, (b) shows a case where the state of the complementary cell is $(R_Y, R_{Yb})=(R_0, R_0)$, (c) shows a case where the state of the complementary cell is $(R_Y, R_{Yb})=(R_1, R_0)$, (d) shows a load characteristic curve and a voltage-current characteristic curve of the data write circuit, (e) shows an example of a resistance-voltage characteristics of a resistive memory element, and (f) shows an example of current flowing through the complementary cell of the data write circuit.

FIG. 12 shows an example of the data write circuit shown in FIG. 9 writing Y=1 into the complementary cell 10C. In detail, (a) of FIG. 12 shows a case where the state of the complementary cell is $R_Y$, $R_{Yb}$)=($R_0$, $R_1$), (b) of FIG. 12 shows a case where the state of the complementary cell is ($R_Y$, $R_{Yb}$)=($R_0$, $R_0$), and (c) of FIG. 12 shows a state where the state of the complementary cell is ($R_Y$, $R_{Yb}$)=($R_1$, $R_0$).

Section (d) of FIG. 12 shows the load characteristic curve and the voltage-current characteristic curve of the data write circuit, (e) of FIG. 12 shows an example of the resistance-voltage characteristics of the resistive memory element, and (f) of FIG. 12 shows an example of current flowing through the complementary cell of the data write circuit.

Note that FIG. 12 shows the writing operation of the configuration of detecting the voltage of the bit line BLb, which is not shown in (a) of FIG. 9.

As shown in (a) of FIG. 12, in the initial state, the state of the complementary cell 10C is $(R_Y, R_{Yb})=(R_0, R_1)$ (Y=0). The resistance value of the complementary cell 10C is $R_0+R_1$. When Y=1 is written into the complementary cell 10C, current is applied from the resistive memory element 10B to the resistive memory element 10A.

At the time T0, the write circuit sets the bit line voltage $V_{BLb}$ to $V_H$, and the current $I_{W0a}$ flows through the complementary cell 10C.

At the time T71, as shown in (b) of FIG. 12, the sense of the magnetization of the free magnetization layer of the resistive memory element 10B is reversed, the low resistance state $R_{Yb}=R_0$ is achieved (transition from [4] state to [7] state in (e) of FIG. 12), the resistive memory element 10A is in the low resistance state $R_Y=R_0$ ([5] state in (b) of FIG. 12 and [5] state in (e) of FIG. 12), the complementary cell 10C transits to $(R_Y, R_{Yb})=(R_0, R_0)$, the resistance value of the complementary cell 10C transits to $R_0+R_0$, the bit line voltage $V_{BLb}$ transits to $V_L$, and the current $I_{W1a}$ flows ([C] state in (f) of FIG. 12, and [C] state in (d) of FIG. 12).

At the time T72, as shown in (c) of FIG. 12, the magnetization of the free magnetization layer in the resistive memory element 10A is reversed, the high resistance state $R_Y=R_1$ is achieved ([6] state in (e) of FIG. 12), the complementary cell 10C transits to $(R_Y, R_{Yb})=(R_1, R_0)$, the resistance value of the complementary cell 10C transits to $R_1+R_0$, the bit line voltage $V_{BLb}$ transits to $V_H$, and the current $I_{W0a}$ flows ([D] state in (f) of FIG. 12, and [D] state in (d) of FIG. 12).

At the time T73, when the writing operation is finished, the word line WL transits to the L level, and the current $I_W$ transits to 0 as shown in (f) of FIG. 12.

Figure 13:
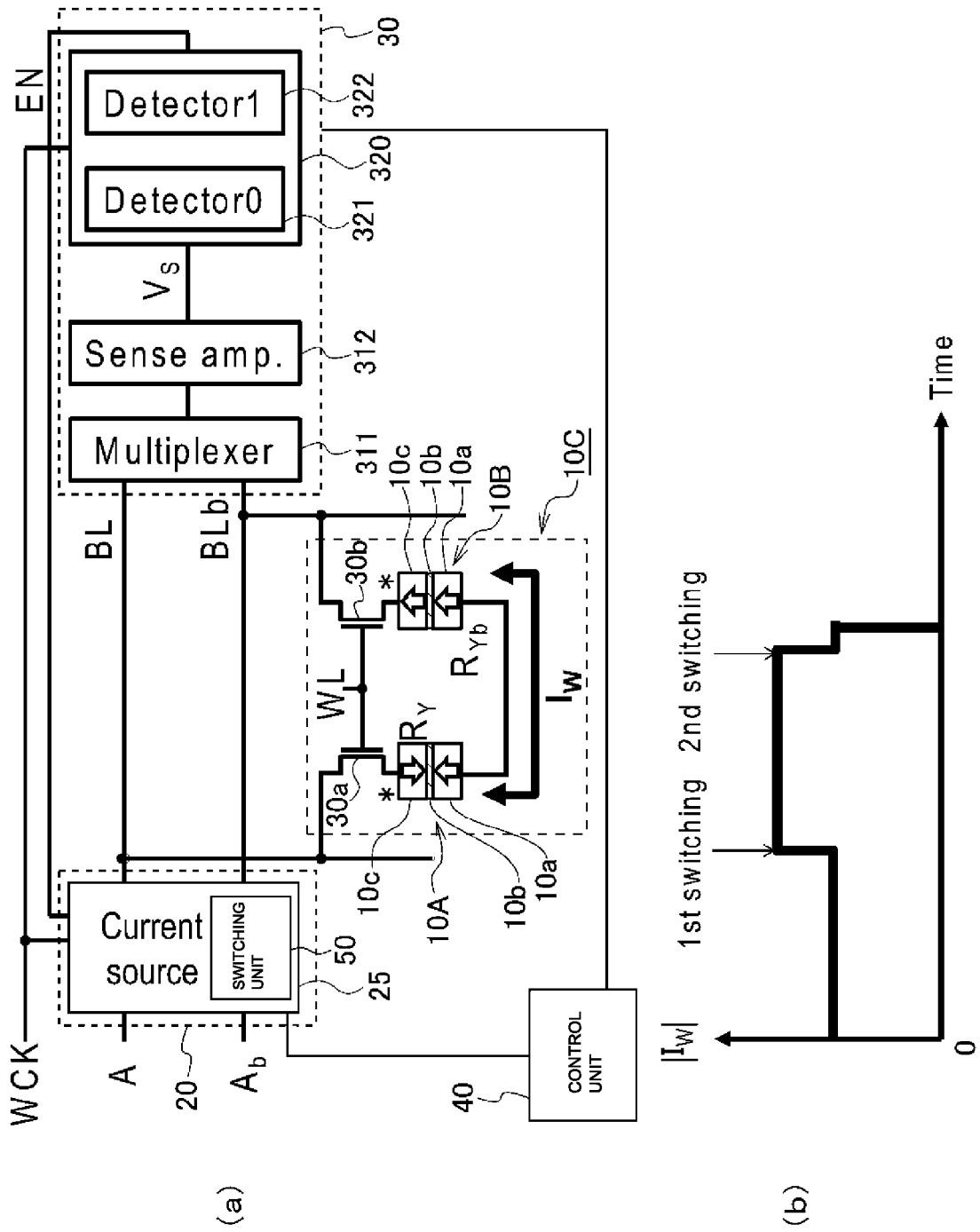
FIG. 13 shows a diagram for illustrating the data write circuit of the resistive memory element according to an example of the embodiment shown in FIG. 8, (a) shows an example of the data write circuit, and (b) shows a timing chart of current $I_W$.

FIG. 13 is a diagram for illustrating a data write circuit of a resistive memory element according to an example of the embodiment shown in FIG. 8. In detail, (a) of FIG. 13 shows an example of the data write circuit, and (b) of FIG. 13 is a timing chart of current $I_W$. In (b) of FIG. 13, the ordinate axis indicates the absolute value of the current $I_W$, and the abscissa axis indicates time (Time). Section (b) of FIG. 13 is the same as (f) in FIGS. 11 and 12. Accordingly, the description is omitted.

The data write circuit of the resistive memory element shown in FIG. 13 includes a write circuit 20 as writing means, a complementary cell 10C, a detection unit 30, and a control unit 40.

In this embodiment, the write circuit 20 includes a writing drive source 25, and a switching unit 50 (switching means).

The writing drive source 25 (current source) is a current source for writing into the resistive memory elements 10A and 10B of the complementary cell 10C.

The switching unit 50 (switching means) applies current through the series-connected memory elements in the complementary resistive memory element, and switches the direction in which the current flows.

The detection unit 30 detects the potential change between the memory elements (resistive memory elements 10A and 10B) series-connected to the writing drive source 25.

The detection unit 30 detects the change of the state of the one memory element (resistive memory element) of the complementary resistive memory element (complementary cell 10C), and the change of the state of the other memory element (resistive memory element).

The control unit 40 performs writing control of the memory elements, based on the writing states of the respective memory elements by the detection unit 30.

In this embodiment, the detection unit 30 as the detection means includes a multiplexer 311 (selection circuit), a sense amplifier 312, and a detection device 320.

The multiplexer 311 switches and outputs the voltage signal indicating one of the resistance changes of the resistive memory elements 10A and 10B of the complementary cell 10C.

The sense amplifier 312 amplifies the voltage of the signal output from the multiplexer 311, and outputs the signal as a voltage signal Vs to the detection device 320.

The detection device 320 includes: first detection means (first detector 321) for detecting the resistance change of one memory element (resistive memory element) of the complementary resistive memory element (complementary cell 10C); and second detection means (second detector 322) for detecting the resistance change of the other memory element (resistive memory element) of the complementary resistive memory element (complementary cell 10C).

The first detector 321 detects completion of writing into any one of the resistive memory elements 10A and 10B, through the first voltage change. The second detector 322 detects completion of writing into the other resistive memory element, through the second voltage change. The detected signals are output.

The writing data signal A, and a writing data signal Ab (reversed) are applied to the write circuit 20. A signal line for inputting the writing clock signal WCK into the write circuit 20 and the detection device 320 is provided for the write circuit 20 and the detection device 320.

The bit lines BL and BLb are electrically connected to the writing drive source 25 (current source) and the multiplexer 311. The bit lines BL and BLb are connected to the sources of respective transistors 30a and 30b.

This embodiment is configured so as to output a detected signal EN, such as a writing end signal, from the detection device 320 to the write circuit 20.

Figure 14:
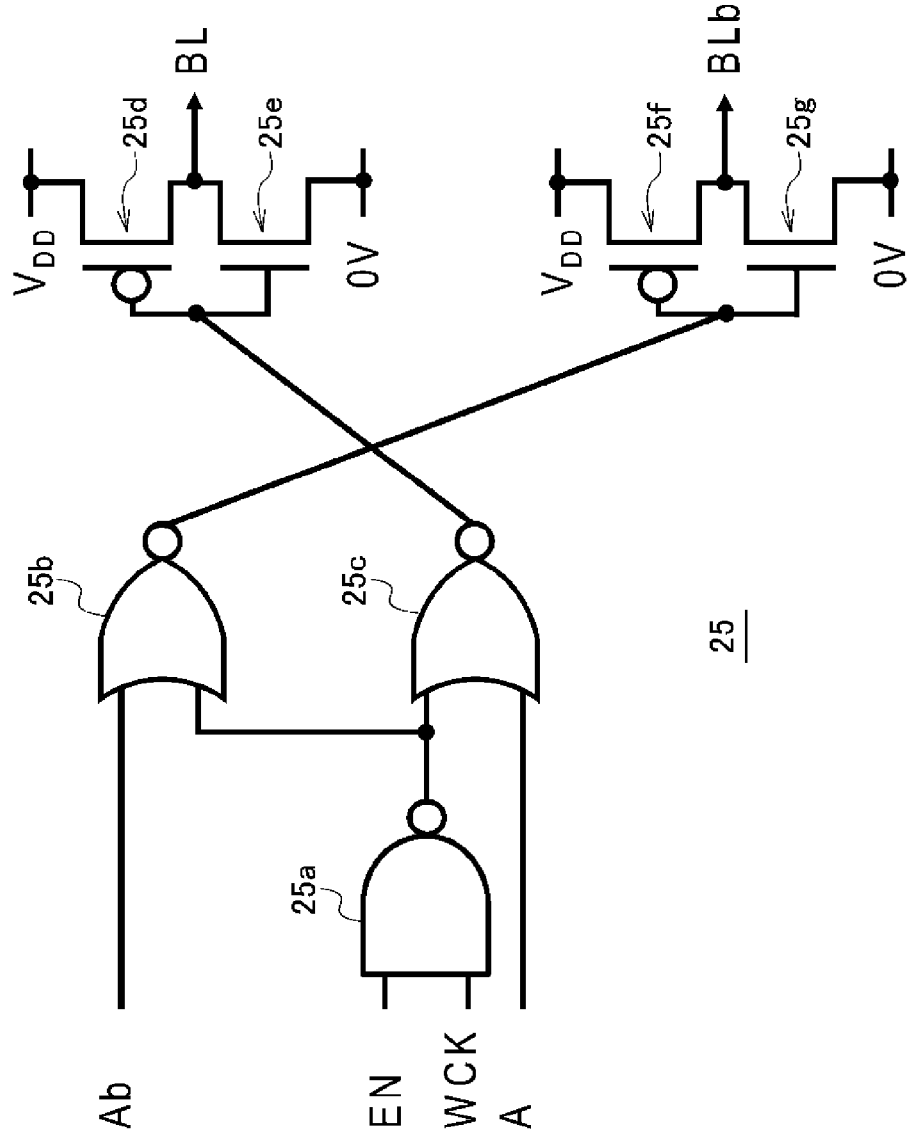
FIG. 14 shows a configuration example of a writing drive source (current source) of the data write circuit of the resistive memory element shown in FIG. 13.

Next, referring to FIG. 14, a configuration example of the writing drive source 25 (current source) of the data write circuit of the resistive memory element shown in FIG. 13 is described.

The writing drive source 25 includes a NAND circuit 25a, a NOR circuit 25b, a NOR circuit 25c, a PMOS transistor 25d, an NMOS transistor 25e, a PMOS transistor 25f, and an NMOS transistor 25g.

An enable signal EN for enabling the clock signal, and the writing clock signal WCK are applied to the NAND circuit 25a. Note that the enable signal EN is an end signal indicating the completion of writing from the detection device, and indicates that the last writing operation is finished and the next writing operation is allowed. Hereinafter, the enable signal EN is represented as the detected signal EN.

The NAND circuit 25a outputs "High" in a case where both the detected signal EN and the writing clock signal WCK are "Low" and in a case where any one of the detected signal EN and the writing clock signal WCK is "Low" and the other is "High," and outputs "Low" in a case where both the detected signal EN and the writing clock signal WCK are "High."

The output from the NAND circuit 25a and the writing data signal Ab (reversed) are applied to the NOR circuit 25b. The output from the NAND circuit 25a and the writing data signal A are applied to the NOR circuit 25c.

The source of the PMOS transistor 25d is connected to the power supply voltage $V_{DD}$, the drain is connected to the bit line BL, and the gate is connected to the output terminal of the NOR circuit 25c.

The source of the NMOS transistor 25e is connected to the bit line BL, the drain is grounded, and the gate is connected to the output terminal of the NOR circuit 25c.

The source of the PMOS transistor 25f is connected to the power supply voltage $V_{DD}$, the drain is connected to the bit line BLb, and the gate is connected to the output terminal of the NOR circuit 25b.

The source of the NMOS transistor 25g is connected to the bit line BLb, the drain is grounded, and the gate is connected to the output terminal of the NOR circuit 25b.

Figure 15:
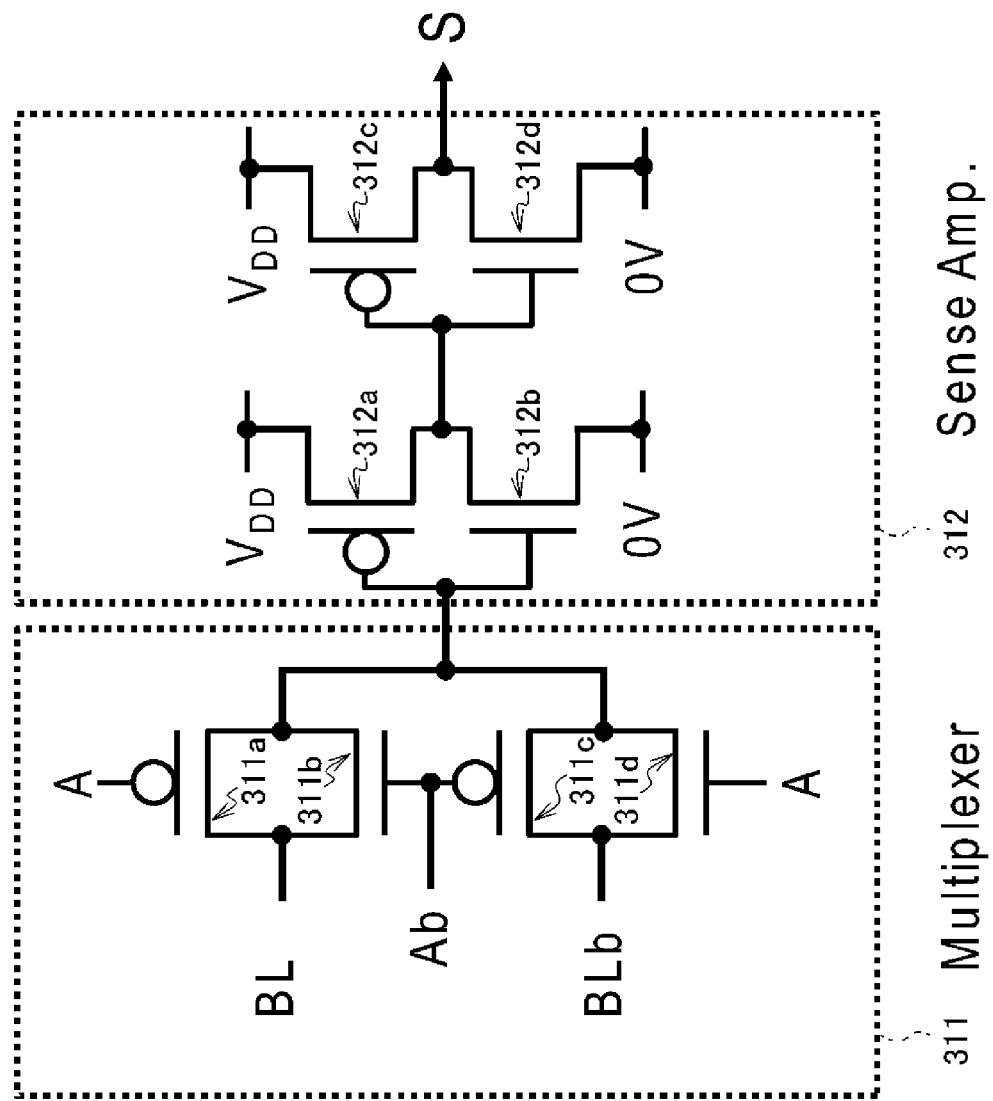
FIG. 15 shows a configuration example of a multiplexer and a sense amplifier of the data write circuit of the resistive memory element shown in FIG. 13.

FIG. 15 shows a configuration example of a multiplexer 311 and a sense amplifier 312 of the data write circuit of the resistive memory element shown in FIG. 13.

The multiplexer 311 includes a PMOS transistor 311a, an NMOS transistor 311b, a PMOS transistor 311c, and an NMOS transistor 311d.

The writing data signal A is applied to the gate of the PMOS transistor 311a, the source is connected to the bit line BL, and the drain is connected to the sense amplifier 312.

The bit line BL is connected to the source of the NMOS transistor 311b, the drain is connected to the sense amplifier 312, and the writing data signal Ab (reversed) is applied to the gate.

The bit line BLb is connected to the source of the PMOS transistor 311c, the drain is connected to the sense amplifier 312, and the writing data signal Ab is applied to the gate.

The bit line BLb is connected to the source of the NMOS transistor 311d, the writing data signal A is applied to the gate, and the drain is connected to the sense amplifier 312.

That is, when the writing data signal A is in the L state, the voltage of the bit line BL is output to the sense amplifier. When the writing data signal A is in the H state, the voltage of the bit line BLb is output to the sense amplifier.

The sense amplifier 312 includes a PMOS transistor 312a, an NMOS transistor 312b, a PMOS transistor 312c, and an NMOS transistor 312d.

The source of the PMOS transistor 312a is connected to the power supply voltage $V_{DD}$, the gate is connected to the output terminal of the multiplexer, and the drain is connected to the gates of the transistors 312c and 312d on the next stage.

The drain of the NMOS transistor 312b is grounded, the gate is connected to the output terminal of the multiplexer, and the drain is connected to the gates of the transistors 312c and 312d on the next stage.

The source of the PMOS transistor 312c is connected to the power supply voltage $V_{DD}$, the gate is connected to the drain of the PMOS transistor 312a and the source of the transistor 312b on the former stage, and the drain is connected to the output terminal for outputting the signal S.

The drain of the NMOS transistor 312d is grounded, the gate is connected to the drain of the PMOS transistor 312a and the source of the transistor 312b on the former stage, and the source is connected to the output terminal for outputting the signal S.

That is, the sense amplifier 312 reverses and amplifies the input signal.

Figure 16:
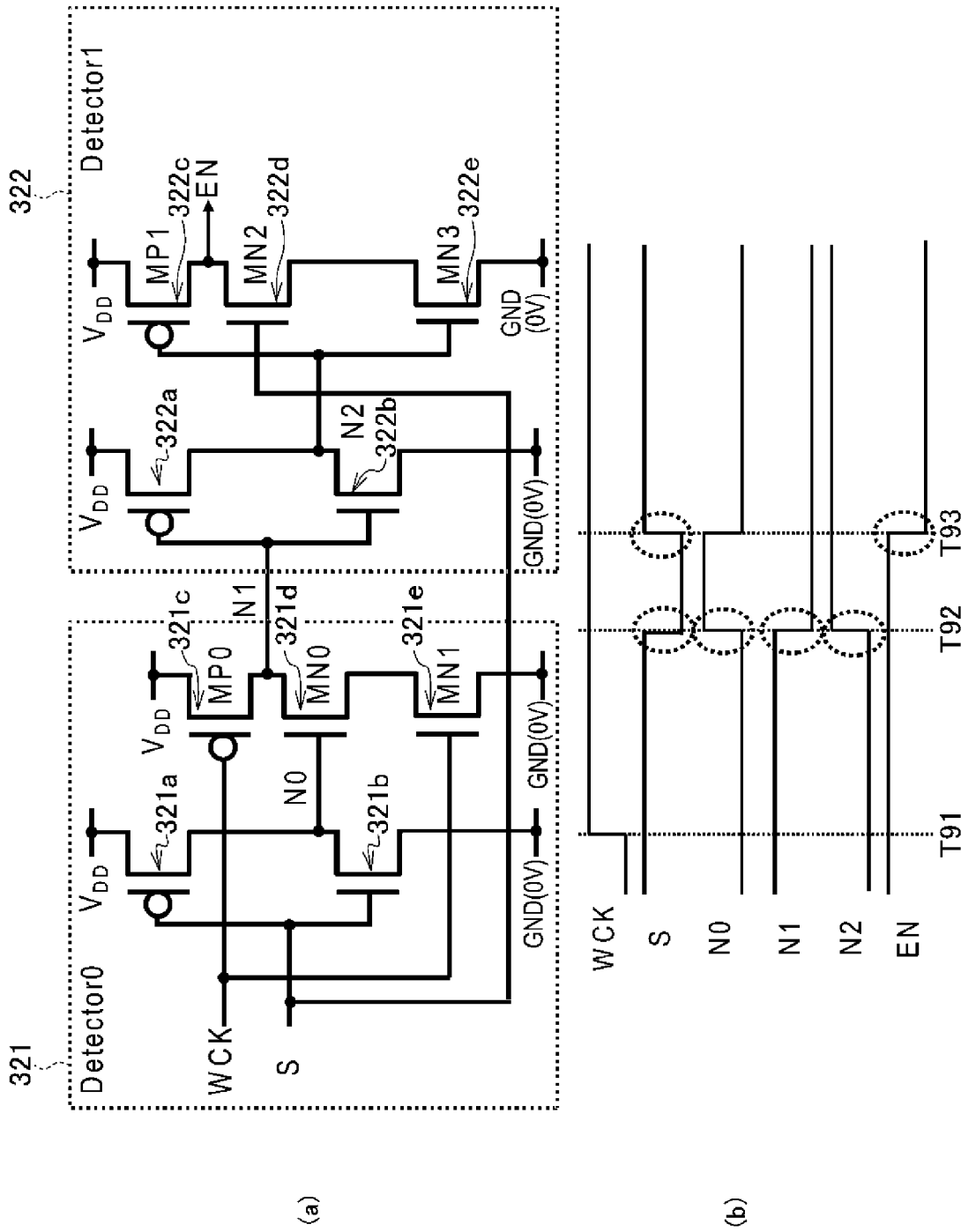
FIG. 16 shows a diagram for illustrating a first detector and a second detector of the data write circuit of the resistive memory element shown in FIG. 13, (a) shows configuration examples of the first detector and the second detector, and (b) shows a timing chart of an example of the operations of the first detector and the second detector in (a)

Section (a) of FIG. 16 shows a configuration example of the first detector 321 (Detector0) and the second detector (Detector1) of the data write circuit of the resistive memory element shown in FIG. 13, and (b) of FIG. 16 is a timing chart showing an example of the operations of the first detector 321 and the second detector 322 in (a) of FIG. 16.

The first detector 321 includes a PMOS transistor 321a, an NMOS transistor 321b, a PMOS transistor 321c (MP0), an NMOS transistor 321d (MN0), and an NMOS transistor 321e (MN1).

The signal S from the sense amplifier is applied to the gate of the PMOS transistor 321a. The source is connected to the power supply voltage $V_{DD}$. The drain is connected to the gate of the NMOS transistor 321d, a node N0, and the source of the NMOS transistor 321b. The signal S from the sense amplifier is applied to the gate of the NMOS transistor 321b. The source is connected to the drain of the PMOS transistor 321a. The drain is grounded (GND (0 V)).

The writing clock signal WCK is applied to the gate of the PMOS transistor 321c (MP0). The source is connected to the power supply voltage $V_{DD}$. The drain is connected to the node N1, and the input terminal of the second detector 322. The gate of the NMOS transistor 321d (MN0) is connected to the node N0. The source is connected to the node N1. The drain is connected to the source of the NMOS transistor 321e. The writing clock signal WCK is applied to the gate of the NMOS transistor 321e (MN1). The drain is grounded. The source is connected to the drain of the NMOS transistor 321d.

The second detector 322 includes a PMOS transistor 322a, an NMOST transistor 322b, a PMOS transistor 322c (MP1), an NMOS transistor 322d (MN2), and an NMOS transistor 322e (MN3).

The gate of the PMOS transistor 322a is connected to the node N1 that is the output terminal of the first detector. The source is connected to the power supply voltage $V_{DD}$. The drain is connected to a node N2. The gate of the NMOST transistor 322b is connected to the node N1 that is the output terminal of the first detector. The source is connected to the node N2. The drain is grounded (GND (0 V)).

The gate of the PMOS transistor 322c (MP1) is connected to the node N2. The source is connected to the power supply voltage $V_{DD}$. The drain is connected to the output terminal. The detected signal EN is output from the output terminal. The signal S from the sense amplifier is applied to the gate of the NMOS transistor 322d (MN2). The source is connected to the output terminal. The drain is connected to the source of the NMOS transistor 322e (MN3). The gate of the NMOS transistor 322e (MN3) is connected to the node N2. The source is connected to the drain of the NMOS transistor 322d (MN2). The drain is grounded (GND (0 V)).

Next, an example of the operations of the first detector 321 and the second detector 322 is described.

As shown in (b) of FIG. 16, at the initial state, the writing clock signal WCK is at L level, the signal S is at the H level, the node N0 is at the L level, the node N1 is at the L level, the node N2 is at the L level, and the detected signal EN is at the H level. The detected signal EN is at the H level. However, the write current does not flow.

At the time T91, the writing clock signal WCK is set to the H level, writing is started, and monitoring is started. The PMOS transistor 321c (MP0) and the NMOS transistor 321d (MN0) are in the off state. The node N1 is in a state of being charged to the H level (1). The NMOS transistor 321e (MN1) is in the on state.

At the time T92, when first writing occurs, the signal S at the L level (0) is input from the sense amplifier, the node N0 transits to the H level (1), the NMOS transistor 321d (MN0) transits to the on state, the node N1 transits to the L level (0), and discharge is performed. The node N2 transits to the high level, the PMOS transistor 322c (MP1) and the NMOS transistor 322d (MN2) are in the off state, and the NMOS transistor 322e (MN3) is in the on state. The output terminal holds the detected signal EN at the H level.

At the time T93, when second writing occurs, upon input of the signal S at the H level (1) from the sense amplifier, the node N0 transits to the L level, the node N1 is at the L level, the node N2 is at the H level, the NMOS transistor 322d (MN2) transits to the on state, the detected signal EN at the L level (0) is output from the output terminal, and completion of the writing operation is detected.

That is, when writing into the complementary cell 10C is finished, the detected signal EN at the L level is output from the output terminal. That is, the completion of writing is detected on the basis of the total two voltage changes accompanying switching of the resistive memory elements 10A and 10B. The control unit finishes the writing operation into the complementary cell 10C on the basis of the detected signal EN indicating the writing completion.

That is, the first detector 321 detects completion of writing into any one of the resistive memory elements 10A and 10B, through the first voltage change. The second detector 322 detects completion of writing into the other resistive memory element, through the second voltage change.

Figure 17:
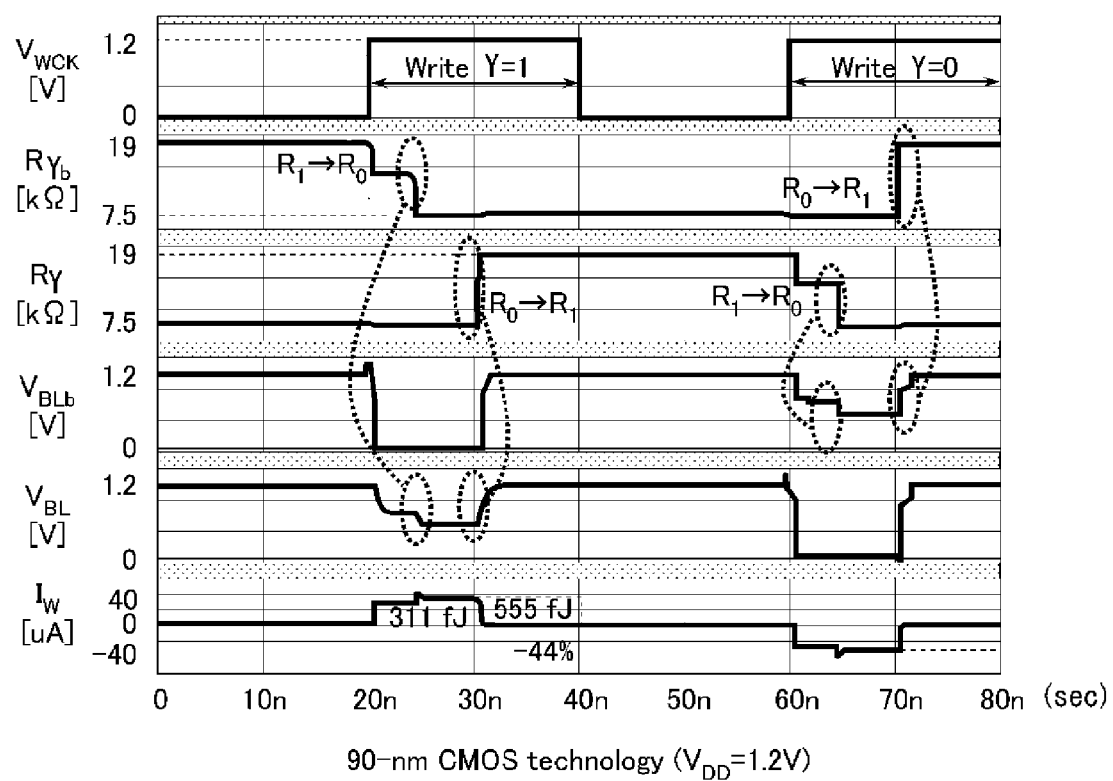
FIG. 17 shows a timing chart for illustrating an operation example of the data write circuit of the resistive memory element shown in FIG. 13.

FIG. 17 is a timing chart for illustrating an operation example of the data write circuit of the resistive memory element shown in FIG. 13.

In FIG. 17, $V_{WCK}$ [V] indicates the voltage level of the writing clock signal, $R_{Yb}$ [kΩ] indicates the resistance value of the resistive memory element 10B, $R_Y$ [kΩ] indicates the resistance value of the resistive memory element 10A, $V_{BLb}$ [V] indicates the voltage level of the bit line BLb, $V_{BL}$ [V] indicates the voltage level of the bit line BL, and $I_W$ [µA] indicates the value of current flowing through the series-connected resistive memory elements 10A and 10B.

In FIG. 17, time 20 to 40 nsec. indicates a case where Y=1 is written into the complementary cell 10C, and time 60 to 80 nsec. indicates a case where Y=0 is written into the complementary cell 10C.

When data Y=1 is written into the complementary cell 10C, the writing clock signal WCK transits to the H level, the current $I_W$ shown in FIG. 17 flows through the complementary cell 10C, the resistive memory element 10B transits from the resistance value $R_1$ to $R_0$, subsequently the resistive memory element 10A transits from the resistance value $R_0$ to $R_1$, the writing clock signal WCK transits to the L level, and the writing of the data Y=1 is finished.

When data Y=0 is written into the complementary cell 10C, the writing clock signal WCK transits to the H level, the current $I_W$ shown in FIG. 17 flows through the complementary cell 10C, the resistive memory element 10A transits from the resistance value $R_1$ to $R_0$, subsequently the resistive memory element 10B transits from the resistance value $R_0$ to $R_1$, the writing clock signal WCK transits to the L level, and writing of the data Y=0 is finished.

In this embodiment, as described above, in the data write circuit of the resistive memory element, current according to the state of each resistive memory element flows from one write circuit to the series-connected resistive memory elements 10A and 10B of the complementary cell 10C, data is written into the resistive memory elements 10A and 10B, and the current change is detected by the detection unit, thereby allowing the writing operation to be securely finished highly accurately.

In the data write circuit of the resistive memory element according to the embodiment of the present invention shown in FIG. 17, writing of Y=1 is performed into the complementary cell during time 20 to 40 nsec. Substantially, in time 20 nsec. to about 31 nsec., write current $I_W$ flows, and the control unit performs control such that the current $I_W$ can transition to 0 after completion of writing is detected and after about 31 nsec. Accordingly, the writing energy during writing is 331 fJ (femtojoules).

On the other hand, according to a comparative example, in a write circuit that performs writing by applying the write current $I_W$ in time 20 to 40 nsec. during writing, the writing energy is 555 fJ.

That is, in comparison with the comparative example, in the data write circuit of the resistive memory element according to the present invention, 333÷555=0.56. Accordingly, the writing energy can be reduced to about 44%.

The inventors of the present application used the resistive memory element (MTJ device) shown in Table 1 for fabricating the data write circuit of the resistive memory element according to the present invention.

TABLE 1

| Diameter | 32 nm |
|---|---|
| RA | 6 Ω·cm² |
| TMR (*) | 1.5 |
| $J_{C0}$ | −3.5 MA/cm² |
| $J_{C1}$ | 2.5 MA/cm² |

(*) TMR = $(R_1 − R_0)/R_0$

"Diameter" indicates the diameter [nm] of the MTJ device. RA indicates the resistance [Ω·cm²] of the element. TMR indicates the resistance ratio between the low resistance when the magnetizations of the fixed magnetization layer and the free magnetization layer are parallel and the high resistance when the magnetizations are antiparallel. $J_{c0}$ and $J_{c1}$ indicate writing threshold current [MA/cm²] when the element is caused to transition from the low resistance state to the high resistance state or from the high resistance state to the low resistance state.

Table 2 shows comparison of the transistor counts used for the write circuit of each embodiment, the number of writing operations (#of write cycles) during writing into the complementary cell, and the sense margin, in a case of fabricating a specific circuit, with respect to the data write circuits of the resistive memory elements of the first embodiment (Type1), the second embodiment (Type2) and the third embodiment (Type3) described above.

TABLE 2

| | Type 1 | Type 2 | Type 3 |
|---|---|---|---|
| transistor counts | 52 (*1) | 40 (*2) | 32 |
| # of write cycles | 1 | 2 | 1 |
| Sense margin (*3) | 260 mV | 260 mV | 201 mV |

Note that in Table 2, (*1) indicates a device that uses two write circuits each including 26 transistors, (*2) indicates a device that uses a write circuit including 26 transistors, two AND circuits (6 transistors) and two NMOS pass gates, and (*3) indicates a case of using 90-nm CMOS technology ($V_{DD}$=1.2 V).

The data write circuit of the resistive memory element of the third embodiment can be configured with a smaller number of transistors in comparison with the first embodiment and the second embodiment, and the circuit scale can be reduced.

In the data write circuit of the resistive memory element of the second embodiment, after writing into one of the resistive memory elements 10A and 10B of the complementary cell 10C is finished, writing into the other resistive memory element is performed. That is, two writing operations are required, with the timing deviating from each other, by the two write circuits. Accordingly, relatively long time is required until writing completion.

On the other hand, the data write circuit of the resistive memory element of the third embodiment can cause the single write circuit to perform simple writing into the complementary cell 10C in one writing operation.

That is, in the data write circuit of the resistive memory element of the third embodiment, a self-terminated mechanism for the complementary cell (complementary MTJ cell) can be achieved while areal and temporal overheads are minimized.

As described above, the data write circuit of the resistive memory element according to the third embodiment of the present invention includes: the complementary resistive memory element (complementary cell 10C) that includes the resistive memory elements 10A and 10B; the writing means (write circuit 20) for making the complementary resistive memory element cause a resistance change; the detection means (detection unit 30) for detecting a writing state in the complementary resistive memory element (complementary cell 10C); and the control means (control unit 40) for controlling writing of the writing means (write circuit 20) on the basis of the detected signal of the detection means (detection unit 30).

The writing means (write circuit 20) includes switching means (switching unit 50) for applying current through the series-connected memory elements (resistive memory elements 10A and 10B) of the complementary resistive memory element (complementary cell 10C) and for switching the direction in which the current flows.

The detection means (detection unit 30) detects the potential change between the memory elements (resistive memory elements 10A and 10B) series-connected to the writing drive source 25 of the write circuit 20, thereby detecting the change of the state of one of the memory elements (resistive memory elements 10A and 10B) of the complementary resistive memory element (complementary cell 10C), and the change of the state of the other one of the memory elements (resistive memory elements 10A and 10B).

That is, with the simple configuration, the detection unit 30 can simply, highly accurately detect the change of the state of one of the memory elements (resistive memory elements 10A and 10B) of the complementary resistive memory element (complementary cell 10C), and the change of the state of the other one of the memory elements (resistive memory elements 10A and 10B).

When the detected signal EN indicating the writing completion is output from the detection unit 30, the control unit 40 performs control so as to finish the writing operation immediately. Accordingly, the energy during writing is small.

The detection means (detection unit 30) includes: first detection means (first detector 321) for detecting the resistance change of one of the memory elements (resistive memory elements 10A and 10B) of the complementary resistive memory element (complementary cell 10C); and second detection means (second detector 322) for detecting the resistance change of the other one of the memory elements (resistive memory elements 10A and 10B) of the complementary resistive memory element (complementary cell 10C).

That is, the resistance change of each of the memory elements (resistive memory elements 10A and 10B) of the complementary resistive memory element (complementary cell 10C) can be simply, highly accurately detected by the first detector 321 and the second detector 322.

When the detected signal EN indicating the writing completion is output from the second detector 322 of the detection unit 30, the control unit 40 performs control so as to finish the writing operation immediately. Accordingly, the energy during writing is small.

By adopting the complementary type, the level of the output signal can be improved. Accordingly, the sense amplifier 312 may have relatively low accuracy.

The embodiments of the present invention have been described above in detail with reference to the drawings. However, the specific configuration is not limited to these embodiments. Even with change in design in a range without departing from the gist of the present invention and the like, the change is covered by the present invention.

The descriptions of the embodiments shown in the aforementioned diagrams can be combined with each other unless the object, configuration and the like do not specifically contradict each other.

The illustration of diagrams can be embodiments independent from each other. The embodiments of the present invention are not limited to one embodiment made up of a combination of the diagrams.

REFERENCE SIGNS LIST 10, 10A, 10B . . . Resistive memory element (MTJ device etc.)
10C . . . Complementary cell (complementary resistive memory element)
10a . . . Fixed magnetization layer
10b . . . Tunnel barrier layer
10c . . . Free magnetization layer
20 . . . Write circuit (writing means)
25 . . . Writing drive source (current source)
30 . . . Detection unit (detection means)
40 . . . Control unit (control means)
50 . . . Switching unit (switching means)
311 . . . Multiplexer
312 . . . Sense amplifier
320 . . . Detection device
321 . . . First detector (first detection means)
322 . . . Second detector (second detection means)

What is claimed is:

1. A data write circuit of a resistive memory element, comprising:
a complementary resistive memory element comprising a first memory element connected between a first bit line and a second bit line, and a second memory element connected between a third bit line and the second bit line;
a writing circuit configured to make the complementary resistive memory element cause a resistance change;
a detection unit configured to detect a writing state in the complementary resistive memory element;
a control unit configured to perform writing control of the first and second memory elements, based on the writing state detected by of the detection unit;
a first switch connected directly between the first bit line and the first memory element; and
a second switch connected directly between the third bit line and the second memory element.

2. The data write circuit of the resistive memory element according to claim 1, wherein:

the writing circuit includes a first writing unit for the first memory element and a second writing unit for the second memory elements; and the first and second memory elements are respectively written by the first and second writing units so as to cause resistance changes opposite to each other simultaneously; and the control unit is further configured to perform writing control of each one of the first and second memory elements, based on the writing state of a respective one of the first and second memory elements that was detected by the detection unit.

3. A data write circuit of a resistive memory element, comprising:
   a complementary resistive memory element;
   a writing circuit configured to make the complementary resistive memory element cause a resistance change;
   a detection unit configured to detect a writing state in the complementary resistive memory element; and
   a control unit;
   wherein the writing circuit includes at least one switching means connected directly to at least one bit line.

4. The data write circuit of the resistive memory element according to claim 3, wherein the at least one switch is configured to apply current through series-connected memory elements in the complementary resistive memory element, and switch a direction in which the current flows;
   wherein the detection unit is configured to detect a potential change between a writing drive source and the series-connected memory elements, and detect a change of a state of each said series-connected memory element in the complementary resistive memory element.

5. The data write circuit of the resistive memory element according to claim 4, wherein the detection unit includes:
   a first detection circuit configured to detect the resistance change of the first one of the series-connected memory elements in the complementary resistive memory element; and
   a second detection circuit configured to detect the resistance change of the second one of the series-connected memory element in the complementary resistive memory element.

* * * * *